United States Patent
Segawa et al.

(10) Patent No.: US 8,830,148 B2
(45) Date of Patent: *Sep. 9, 2014

(54) ORGANIC ELECTROLUMINESCENCE DISPLAY DEVICE AND ORGANIC ELECTROLUMINESCENCE DISPLAY DEVICE MANUFACTURING METHOD

(75) Inventors: Yasuo Segawa, Hyogo (JP); Tetsurou Nakamura, Kyoto (JP); Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 223 days.

This patent is subject to a terminal disclaimer.

(21) Appl. No.: 13/403,375

(22) Filed: Feb. 23, 2012

(65) Prior Publication Data

US 2012/0154460 A1   Jun. 21, 2012

Related U.S. Application Data

(63) Continuation of application No. PCT/JP2010/002484, filed on Apr. 5, 2010.

(51) Int. Cl.
  *G09G 3/32* (2006.01)
  *H01L 27/32* (2006.01)

(52) U.S. Cl.
  CPC ...... *H01L 27/3276* (2013.01); *G06G 2360/147* (2013.01); *H01L 27/3265* (2013.01); *G09G 2300/0819* (2013.01); *G09G 3/3233* (2013.01); *G09G 2320/043* (2013.01); *G09G 2300/0852* (2013.01)
  USPC .................. 345/77; 345/76; 345/82; 345/204; 345/690; 345/694; 315/169.3; 313/463

(58) Field of Classification Search
  CPC ...................................... G09G 3/32
  USPC .............. 345/76–79, 82, 204–205, 211, 213, 345/690–691; 315/169.1–169.3; 445/3; 313/463
  See application file for complete search history.

(56) References Cited

U.S. PATENT DOCUMENTS 6,473,065 B1 * 10/2002 Fan ................................ 345/82
7,329,849 B2    2/2008 Kasai
(Continued)

FOREIGN PATENT DOCUMENTS

JP    2001-231053    8/2001
JP    2005-284172    10/2005
(Continued)

OTHER PUBLICATIONS

International Search Report in PCT/JP2010/002484, dated Apr. 27, 2010.
(Continued)

*Primary Examiner* — Lun-Yi Lao
*Assistant Examiner* — Md Saiful A Siddiqui
(74) *Attorney, Agent, or Firm* — Greenblum & Bernstein, P.L.C.

(57) ABSTRACT

An organic electroluminescence display device includes a display panel including pixels. The pixels each include a light-emitter, driver and capacitor. A storage is configured to store a correction parameter for each of the pixels for correcting, in accordance with characteristics of each of the pixels, an image signal input from an external source. A controller is configured to, for each pixel of the pixels, obtain a corrected signal voltage by reading the correction parameter corresponding to the pixel from the storage and multiplying the image signal corresponding to the pixel by the correction parameter corresponding to the pixel. The storage is configured to store a gain and not an offset as the correction parameter.

16 Claims, 24 Drawing Sheets

(56) References Cited

U.S. PATENT DOCUMENTS

| | | |
|---|---|---|
| 7,518,621 B2 | 4/2009 | Kinoshita et al. |
| 7,719,492 B2 | 5/2010 | Childs |
| 7,834,825 B2 | 11/2010 | Mizukoshi et al. |
| 7,859,492 B2 | 12/2010 | Kohno |
| 7,907,137 B2 | 3/2011 | Shirasaki et al. |
| 7,982,695 B2 | 7/2011 | Mizukoshi et al. |
| 8,026,927 B2 | 9/2011 | Daly et al. |
| 8,059,070 B2 | 11/2011 | Odawara et al. |
| 2006/0066530 A1* | 3/2006 | Azami et al. ............ 345/76 |
| 2006/0214940 A1 | 9/2006 | Kinoshita et al. |
| 2006/0221015 A1 | 10/2006 | Shirasaki et al. |
| 2006/0231740 A1 | 10/2006 | Kasai |
| 2006/0284802 A1 | 12/2006 | Kohno |
| 2007/0008251 A1 | 1/2007 | Kohno et al. |
| 2007/0164959 A1 | 7/2007 | Childs |
| 2007/0210996 A1 | 9/2007 | Mizukoshi et al. |
| 2008/0238934 A1 | 10/2008 | Daly et al. |
| 2009/0256854 A1 | 10/2009 | Mizukoshi et al. |
| 2010/0007645 A1* | 1/2010 | Ono ............................ 345/211 |
| 2010/0253715 A1* | 10/2010 | Odawara et al. ............ 345/690 |

FOREIGN PATENT DOCUMENTS

| | | |
|---|---|---|
| JP | 2006-284716 | 10/2006 |
| JP | 2006-301159 | 11/2006 |
| JP | 2006-349966 | 12/2006 |
| JP | 2007-018876 | 1/2007 |
| JP | 2007-519956 | 7/2007 |
| JP | 2008-250319 | 10/2008 |
| JP | 2008-287179 | 11/2008 |
| JP | 2009-258302 | 11/2009 |
| WO | 2004/086345 | 10/2004 |
| WO | 2008/152817 | 12/2008 |
| WO | 2009/144936 | 12/2009 |

OTHER PUBLICATIONS

U.S. Patent Application No. 13/403,489 to Yasuo Segawa et al., filed Feb. 23, 2012.

* cited by examiner

FIG. 14

| 102a | | | |
|---|---|---|---|
| (a11) | (a12) | ⋮ | (a1n) |
| (a21) | (a22) | ⋮ | (a2n) |
| (a31) | (a32) | ⋮ | (a3n) |
| ⋯ | ⋯ | ⋮ | ⋯ |
| (am1) | (am2) | ⋮ | (amn) |

| | Initial | | External correction | |
|---|---|---|---|---|
| | Vth | μ、Ion | Vth | μ、Ion |
| Vth compensation circuit | ○ | × | ○ | × |
| Conventional external compensation Gain, offset | ○ | ○ | × | × |
| Addition effect | ○ | ○ | ○ | × |

(b)

| | Initial | | External correction | |
|---|---|---|---|---|
| | Vth | μ、Ion | Vth | μ、Ion |
| Vth compensation circuit | ○ | × | ○ | × |
| 1-point measurement gain | × | ○ | × | × |
| Addition effect | ○ | ○ | ○ | × |

ORGANIC ELECTROLUMINESCENCE DISPLAY DEVICE AND ORGANIC ELECTROLUMINESCENCE DISPLAY DEVICE MANUFACTURING METHOD

CROSS REFERENCE TO RELATED APPLICATION

This is a continuation application of PCT Application No. PCT/JP2010/002484 filed on Apr. 5, 2010, designating the United States of America, the disclosure of which, including the specification, drawings and claims, is incorporated herein by reference in its entirety.

BACKGROUND OF THE INVENTION

1. Field of the Invention

The present invention relates to an organic electroluminescence display device and an organic electroluminescence display device manufacturing method.

2. Description of the Related Art

Image display devices (organic EL displays) using organic electroluminescence elements (OLED: Organic Light-Emitting Diodes) are well-known as image display devices using current-driven light-emitting elements. Due to such advantages as excellent viewing angle characteristics and low power consumption, such organic EL displays have gained much attention as candidates for next-generation flat panel displays (FPDs).

In organic EL display devices, organic EL elements included in pixels are normally arranged in a matrix. In an organic EL display referred to as a passive-matrix organic EL display, an organic EL element is provided at each crosspoint between row electrodes (scanning lines) and column electrodes (data lines), and such organic EL elements are driven by applying a voltage equivalent to a data signal, between a selected row electrode and the column electrodes.

On the other hand, in an organic EL display device referred to as an active-matrix organic EL display, a thin film transistor (TFT) is provided in each crosspoint between scanning lines and data lines, the gate of a drive transistor is connected to the TFT, the TFT is turned ON through a selected scanning line so as to input a data signal from a data line to the drive transistor, and an organic EL element is driven by such drive transistor.

Unlike in the passive-matrix organic EL display where, only during the period in which each of the row electrodes (scanning lines) is selected, does the organic EL element connected to the selected row electrode emit light, in the active-matrix organic EL display, it is possible to cause the organic EL element to emit light until a subsequent scan (selection), and thus a reduction in display luminance is not incurred even when the number of scanning lines increases. Therefore, since driving with low voltage is possible, reduction of power consumption becomes possible. However, in the active-matrix organic EL display, due to variation in the characteristics of drive transistors and organic EL elements arising in the manufacturing process, the luminance of the organic EL elements are different among the respective pixels even when the same data signal is supplied, and thus there are instances where luminance unevenness, such as a band or unevenness, occurs. Specifically, an error occurs between the voltage-luminance characteristics of each pixel and representative voltage-luminance characteristics that are common among pixels. Here, in the voltage-luminance characteristics of each pixel, the variation with the high gradation region of the representative voltage-luminance characteristics is mainly due to variation in drive transistor mobility, and the variation with the low gradation region of the representative voltage-luminance characteristics is mainly due to variation in drive transistor threshold voltage (Vth).

In response, there is proposed a correction method of correcting the luminance unevenness occurring in an organic EL display in which, by correcting an image signal (data signal), the luminance of the organic EL elements corresponding to the image signal supplied to the respective pixels can be corrected to a predetermined standard luminance (for example, Patent Reference 1: Unexamined Japanese Patent Application Publication No. 2005-284172.

In the correction method of Patent Reference 1, by measuring the luminance distribution or current distribution of at least three gradation levels in each pixel of an organic EL display, it is possible to obtain the gain and offset which are correction parameters for correcting the luminance of the organic EL element corresponding to the image signal supplied to the respective pixels to a predetermined standard luminance, that is, for correcting the drive transistor variation.

Meanwhile, a method of configuring a Vth compensation circuit in a pixel of an organic EL display, and suppressing variation in the characteristics of drive transistors has been proposed (for example, Patent Reference 2: WO/2008/152817).

The correction method of Patent Reference 2 evens-out the display, in other words, suppresses luminance unevenness in an organic EL display by suppressing Vth variation in the TFT characteristics of drive transistors in the initial characteristics and the Vth variation following deterioration over time.

However, the conventional correction methods have the problems described below.

For example, as a correction method of Patent Reference 1, there is a method of obtaining gain and offset, which are correction parameters, using the least-square technique. In this method which uses the least-square technique, multi-gradation level luminance measurement is performed for each pixel, and the gain and offset are obtained using a predetermined calculation method, based on the luminance difference between the luminance of each pixel obtained in each measurement and the representative voltage-luminance characteristics. This method shall be described.

FIG. 1 is a diagram showing a configuration of a conventional luminance measurement system at the time of luminance measurement. FIG. 2 is a flowchart for describing the conventional correction method. FIG. 3 is a graph showing an example of a case where correction parameters are obtained using the least-square technique.

The conventional luminance measurement is performed on each pixel included in a display panel 806 of a conventional organic EL display device 800, for a number of gradation levels that is at least 3 gradation levels and preferably 5 gradation levels or more, using a measuring device 910. Here, the conventional organic EL display device 800 includes the display panel 806 and a control unit 801. Furthermore, the luminance measurement system includes the organic EL display device 800, the measuring device 910, and a correction parameter determining device 900.

The measuring device can measure luminance that is emitted by the pixels included in the display panel 806. The correction parameter determining device 900 is a device which determines the correction parameters, that is, the gain and the offset for correcting the luminance of the pixels included in the display panel 806 to the standard luminance, based on the luminance of each pixel measured by the measuring device 910.

In this luminance measurement system, luminance measurement is performed on each pixel for a number of gradation levels that is 5 gradation levels or more, as shown in FIG. 2. Specifically, a pixel included in the display panel 806 is caused to display (emit light) at a certain gradation level (N gradation level) (S801), and the luminance of the pixel is measured using the measuring device 910 (S802). Subsequently, the data indicating the luminance measurement value for the N gradation level is, for example, stored in a memory or the like of a personal computer (PC) connected to the measuring device 910 or the correction parameter determining device 900 (S803), then S801 to 5803 are repeated up to the number of gradation levels for measurement (S804, S805). When the number of times the luminance measurement is performed reaches the number of gradation levels for measurement (Y in S804), a correction process is performed by the correction parameter determining device 900 (S806). Here, the correction parameter determining device 900 measures, for a certain pixel for example, luminance L1 to L6 at the six points (N=6 is assumed) of voltages V1 to V6 using the least-square technique, and obtains V×1 to V×6 as the correction parameters, as shown in FIG. 3. Subsequently, the correction parameter determining device 900 writes the correction parameters (gain and offset) for each pixel into a memory included in the control unit 801.

However, as described above, in the correction method of Patent Reference 1 which uses the least-square method for example, by nature it is necessary to perform the luminance measurement on each pixel for a number of gradation levels that is at least 3 gradation levels and preferably 5 gradation levels or more, and thus there is the problem of requiring time from the performance of the luminance measurement for each pixel up to the obtainment of the correction parameters. In particular, a very long time is required for the luminance measurement in the low gradation-side.

Furthermore, in an organic EL display, there is a tendency for the occurrence of streaky luminance unevenness in the low gradation regions. The human eye recognizes luminance differences more easily in the low gradation-side than in the high gradation-side. As such, it is preferable that correction precision be higher for the low gradation-side than the high gradation-side. However, normally, the luminance difference between the representative voltage-luminance characteristics and the voltage-luminance characteristics of each pixel increases as one goes further into the high gradation-side, and since the least-square method simultaneously obtains the gain and offset by calculation so that the luminance error in the high gradation-side is minimized, there is the problem that, although the correction error in the high gradation-side can be minimized, the correction error in the low gradation-side becomes big compared to that in the high gradation-side.

On the other hand, in the correction method shown in Patent Reference 2, it is possible to cope with the variation in TFT threshold voltage Vth of the drive transistors by configuring a Vth compensation circuit, but it is not possible to sufficiently correct the variation in TFT mobility. As such, there is the problem that, in the displaying in an organic EL display, luminance unevenness corresponding to the mobility variation remains.

SUMMARY OF THE INVENTION

The present invention is conceived in view of the above-described circumstances and has as an object to provide an organic EL display device and an organic EL display device manufacturing method which can shorten the measurement tact from the performance of luminance measurement for each pixel to the obtainment of the correction parameter.

In order to achieve the aforementioned object, an organic electroluminescence (EL) display device according to the present invention includes: a display panel including pixel units each of which includes a light-emitting element, a drive element which is voltage-driven and controls supply of current to the light-emitting element, and a capacitor having a first electrode connected to a gate electrode of the drive element and a second electrode connected to one of a source electrode and a drain electrode of the drive element; a storage unit configured to store, for each of the pixel units, a correction parameter for correcting, in accordance with characteristics of the pixel unit, an image signal inputted from an external source; and a control unit configured to obtain, for each of the pixel units, a corrected signal voltage by reading, from the storage unit, the correction parameter corresponding to the pixel unit and multiplying the image signal corresponding to the pixel unit by the read correction parameter, wherein the control unit is configured (i) to cause, with each writing of the corrected signal voltage to a corresponding one of the pixel units, the capacitor included in the corresponding one of the pixel units to detect a threshold voltage of the drive element, (ii) to cause the capacitor to hold a corresponding-voltage that corresponds to the threshold voltage of the drive element after the capacitor detects the threshold voltage, (iii) to supply the corrected signal voltage to the capacitor in a state where the capacitor is holding the corresponding-voltage, and (iv) to cause the current to flow to the light-emitting element by supplying a predetermined signal voltage between the gate electrode and the source electrode of the drive element, the predetermined signal voltage being obtained by adding the corrected signal voltage to the threshold voltage, the correction parameter is generated by: obtaining a function of representative voltage-luminance characteristics common among the pixel units included in the display panel; causing the capacitor included in a subject pixel unit to hold the corresponding-voltage that corresponds to the threshold voltage of the drive element, the subject pixel unit being a current pixel unit to be processed among the pixel units included in the display panel; applying, to the drive element included in the subject pixel unit, a corresponding-signal voltage that corresponds to a single gradation level belonging to a high gradation region of the representative voltage-luminance characteristics, in the state where the capacitor is holding the corresponding-voltage, and measuring, using a predetermined measuring device, luminance emitted by the subject pixel unit; calculating, for each of the pixel units, the correction parameter with which the luminance of the subject pixel unit measured in the measuring becomes a standard luminance obtained when the corresponding-signal voltage is inputted to the function of the representative voltage-luminance characteristics; and storing the correction parameter calculated in the calculating, in the storage unit, in association with the subject pixel unit, in the calculating, a voltage is calculated, the voltage being a voltage such that the luminance emitted when the subject pixel unit is caused to emit light according to the corresponding-signal voltage is the standard luminance, and the correction parameter is a gain indicating a ratio between the corresponding-signal voltage and the calculated voltage.

According to the present invention, by configuring a Vth correction circuit inside the pixel and, in addition, and performing luminance correction in only one gradation level at the time of manufacturing, it is not only possible to suppress initial Vth and mobility variance, improve display uniformity, and suppress burn-in and the like through compensation of Vth deterioration, but the gradation levels to be measured can also be limited to one gradation level and, in addition, only the high-luminance portion is measured, and thus luminance measurement tact can be shortened.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 14 is a diagram showing an example of a correction parameter table held by a storage unit in the present embodiment;

FIG. 24 is a diagram for describing effects of the organic EL display device and the manufacturing method thereof according to the present invention.

DESCRIPTION OF THE PREFERRED EMBODIMENT(S)

Figure 1:
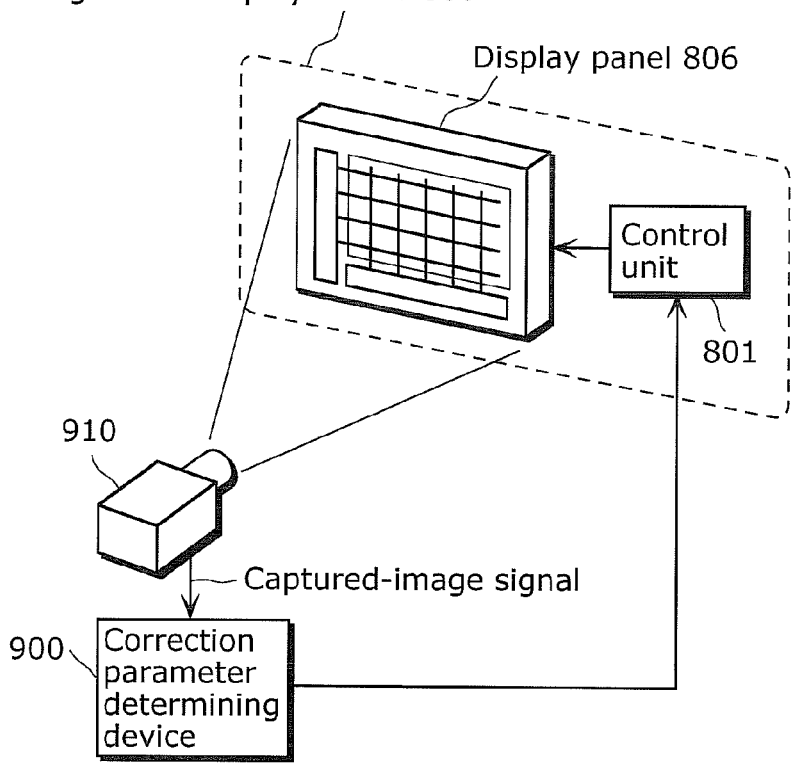
FIG. 1 is a diagram showing a configuration of a conventional luminance measurement system at the time of luminance measurement.
Figure 2:
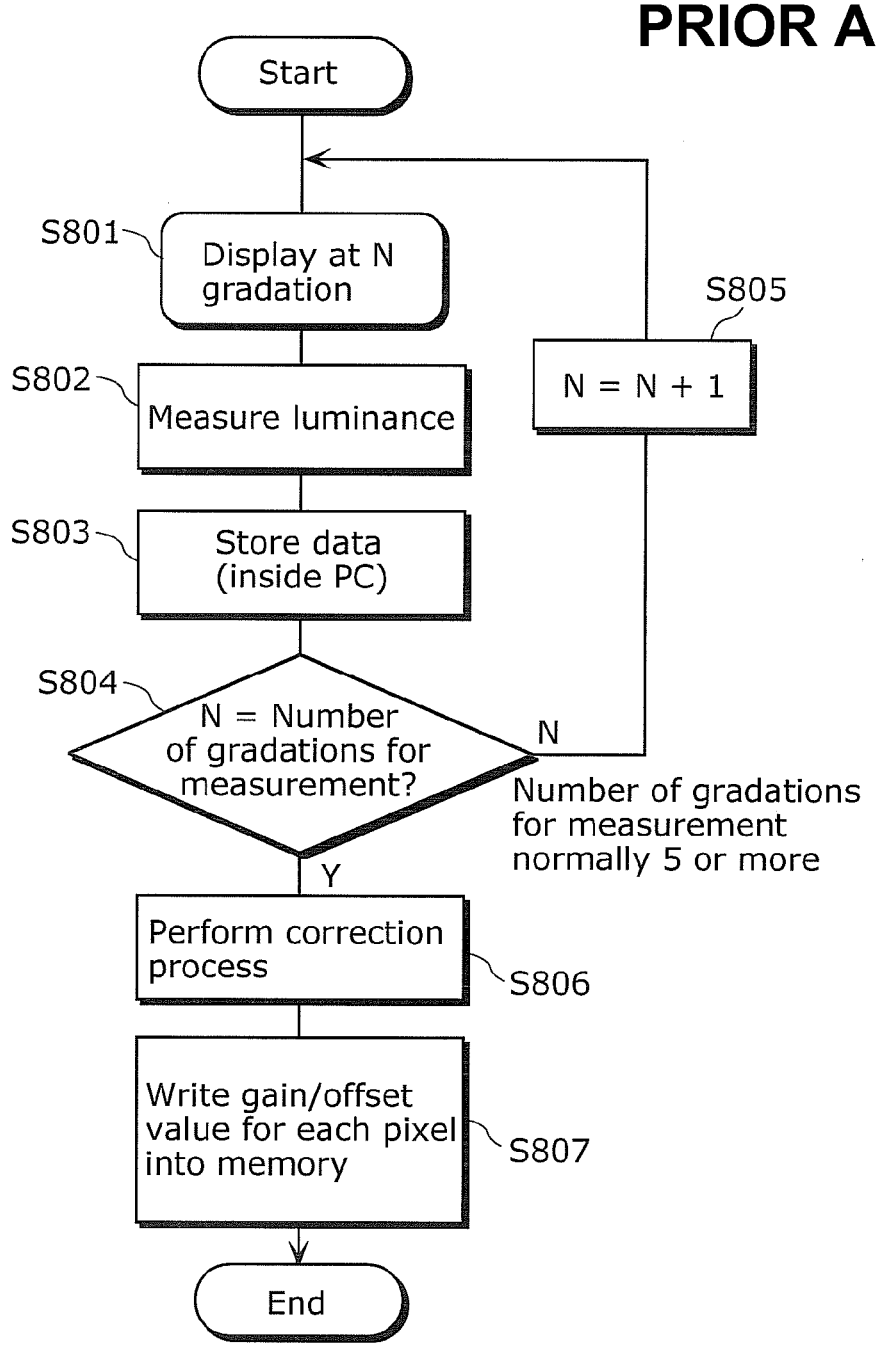
FIG. 2 is a flowchart for describing the conventional correction method.
Figure 3:
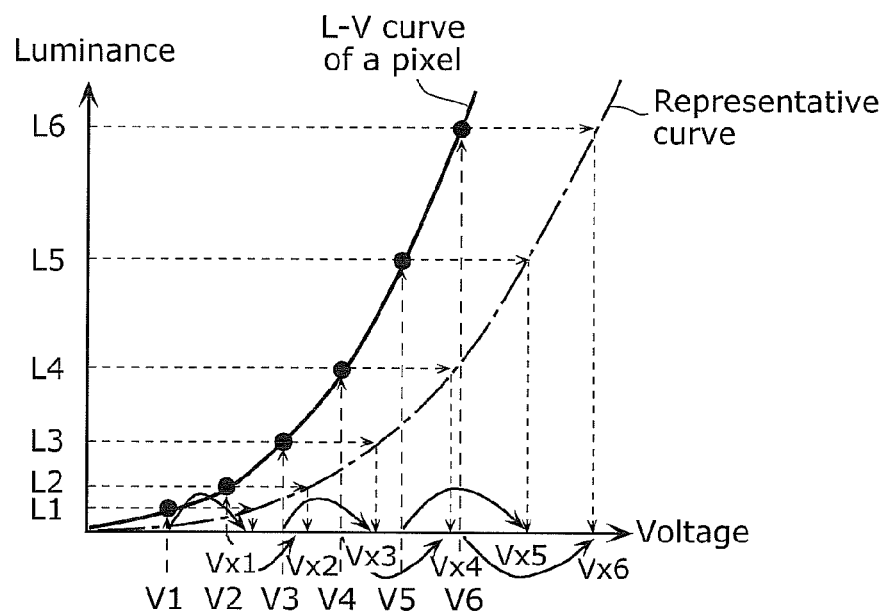
FIG. 3 is a graph showing an example of a case where correction parameters are obtained using the least-square technique.

An organic electroluminescence (EL) display device according to a first aspect includes: a display panel including pixel units each of which includes a light-emitting element, a drive element which is voltage-driven and controls supply of current to the light-emitting element, and a capacitor having a first electrode connected to a gate electrode of the drive element and a second electrode connected to one of a source electrode and a drain electrode of the drive element; a storage unit configured to store, for each of the pixel units, a correction parameter for correcting, in accordance with characteristics of the pixel unit, an image signal inputted from an external source; and a control unit configured to obtain, for each of the pixel units, a corrected signal voltage by reading, from the storage unit, the correction parameter corresponding to the pixel unit and multiplying the image signal corresponding to the pixel unit by the read correction parameter, wherein the control unit is configured (i) to cause, with each writing of the corrected signal voltage to a corresponding one of the pixel units, the capacitor included in the corresponding one of the pixel units to detect a threshold voltage of the drive element, (ii) to cause the capacitor to hold a corresponding-voltage that corresponds to the threshold voltage of the drive element after the capacitor detects the threshold voltage, (iii) to supply the corrected signal voltage to the capacitor in a state where the capacitor is holding the corresponding-voltage, and (iv) to cause the current to flow to the light-emitting element by supplying a predetermined signal voltage between the gate electrode and the source electrode of the drive element, the predetermined signal voltage being obtained by adding the corrected signal voltage to the threshold voltage, the correction parameter is generated by: obtaining a function of representative voltage-luminance characteristics common among the pixel units included in the display panel; causing the capacitor included in a subject pixel unit to hold the corresponding-voltage that corresponds to the threshold voltage of the drive element, the subject pixel unit being a current pixel unit to be processed among the pixel units included in the display panel; applying, to the drive element included in the subject pixel unit, a corresponding-signal voltage that corresponds to a single gradation level belonging to a high gradation region of the representative voltage-luminance characteristics, in the state where the capacitor is holding the corresponding-voltage, and measuring, using a predetermined measuring device, luminance emitted by the subject pixel unit; calculating, for each of the pixel units, the correction parameter with which the luminance of the subject pixel unit measured in the measuring becomes a standard luminance obtained when the corresponding-signal voltage is inputted to the function of the representative voltage-luminance characteristics; and storing the correction parameter calculated in the calculating, in the storage unit, in association with the subject pixel unit, in the calculating, a voltage is calculated, the voltage being a voltage such that the luminance emitted when the subject pixel unit is caused to emit light according to the corresponding-signal voltage is the standard luminance, and the correction parameter is a gain indicating a ratio between the corresponding-signal voltage and the calculated voltage.

In the present aspect, in the manufacturing process of the organic EL display device, luminance measurement for each pixel is performed only once on one gradation level belonging to a high gradation region of the representative voltage-luminance characteristics, and a correction parameter for matching the luminance at the one gradation level belonging to the high gradation region of the representative voltage-luminance characteristics is calculated from this one-time luminance measurement. Then, the image signal inputted from the external source is corrected by multiplying the image signal by the correction parameter, and a corrected signal voltage which corresponds to the corrected image signal is applied to the respective pixel units. Furthermore, a circuit for compensating the threshold voltage of a drive element is configured in each of the pixel units included in the display panel of the organic EL display apparatus. Specifically, the corrected signal voltage is supplied to the capacitor in the state where the capacitor is holding the corresponding-voltage that corresponds to the threshold voltage of the drive element. Subsequently, current is caused to flow to the light-emitting element by supplying, between the gate and source electrodes of the drive element, a predetermined signal voltage obtained by adding the corrected signal voltage to the aforementioned corresponding-voltage.

Accordingly, since the light-emitting element is caused to emit light by supplying the predetermined signal voltage between the gate and source electrodes of the drive element, the drive current of the drive element which flows to the light-emitting element becomes a current corresponding to a voltage obtained by subtracting the threshold voltage of the drive element from the predetermined signal voltage. As such, it is possible to suppress variation of threshold voltage among drive elements included in the respective pixel units.

In this manner, variation of threshold voltage among drive elements included in the respective pixel units can be suppressed in the state where the luminance in the one gradation level belonging to the high gradation region is matched to the representative voltage-luminance characteristics, and thus correction precision in the low gradation region of the representative voltage-luminance characteristics can be enhanced.

Furthermore, since the correction parameter can be calculated by merely performing the luminance measurement for one gradation level belonging to the high gradation region of the representative voltage-luminance characteristics, for the luminance measurement for the respective pixel units, in the manufacturing process of the organic EL display device, it is possible to significantly shorten the measurement tact from when luminance measurement for the respective pixel units is performed up to when the correction parameter is calculated, as compared to the conventional least-square method.

Meanwhile, in the conventional method of correcting the image signal using the correction parameter obtained at the time of the manufacturing process, it is possible to correct the initial mobility and threshold voltage of a drive element. However, deterioration over time arises in the drive element characteristics due to the frequency of use. As a result, the variation in threshold voltages thereof also changes with the passing of time. As such, with the conventional correction method, it is not possible to perform correction up to the threshold voltage following the deterioration over time of drive element characteristics. Meanwhile, in the case where a circuit for correcting the threshold voltage is configured in a pixel unit, even when the image signal is supplied without being corrected using the correction parameter, it is possible to correct not only the threshold voltage in the initial period of the drive element, but also the threshold voltage following the deterioration over time of the drive element characteristics. However, it was not possible to correct the variation in drive element mobility in the initial period.

In contrast, in the present aspect, the threshold voltage of the drive element is corrected in the pixel unit while the image signal is corrected using the correction parameter, and thus, together with being able to correct initial mobility and threshold voltage of the drive element, it is possible to correct even the deterioration over time of the threshold voltage of the drive element.

In an organic EL display device according to a second aspect, in the calculating, a voltage is calculated, the voltage being a voltage such that the luminance emitted when the subject pixel unit is caused to emit light according to the corresponding-signal voltage is the standard luminance, and the correction parameter is a gain indicating a ratio between the corresponding-signal voltage and the calculated voltage.

In an organic EL display device according to a third aspect, the correction parameter is a gain indicating a ratio between the luminance when the subject pixel is caused to emit light according to the corresponding signal voltage and the standard luminance.

In an organic EL display device according to a fourth aspect, the second electrode of the capacitor is connected to the source electrode of the drive element, each of the pixel units further includes: a first power line for determining a potential of the drain electrode of the drive element; a second power line connected to a second electrode of the light-emitting element; a third power line for supplying a first standard voltage which defines a voltage value of the first electrode of the capacitor; a data line for supplying a signal voltage; a first switching element which has one of terminals connected to the data line and the other of the terminals connected to the first electrode of the capacitor, and which switches between conduction and non-conduction between the data line and the first electrode of the capacitor; a second switching element which has one of terminals connected to the third power line and the other of the terminals connected to the first electrode of the capacitor, and which switches between conduction and non-conduction between the third power line and the first electrode of the capacitor; a third switching element which has one of terminals connected to the source electrode of the drive element and the other of the terminals connected to the second electrode of the capacitor, and which switches between conduction and non-conduction between the source electrode of the drive element and the second electrode of the capacitor; a second capacitor having a first electrode connected to the second electrode of the capacitor; and a bias voltage line connected to a second electrode of the second capacitor, for causing a second standard voltage to be generated in the second electrode of the capacitor, the second standard voltage being lower than a value obtained by subtracting the threshold voltage of the drive element from the first standard voltage, and the control unit is configured to (i) cause the capacitor to generate a potential difference that is larger than the threshold voltage of the drive element by applying the first standard voltage to the first electrode of the capacitor by placing the second switching element in an ON state in a state where the third switching element is ON, after placing the first switching element in an OFF state, and by applying the second standard voltage to the second electrode of the second capacitor, (ii) to cause the capacitor to hold the corresponding-voltage that corresponds to the threshold voltage of the drive element by placing the second switching element and the third switching element in the OFF state after allowing passage of time up to when a potential difference between the first electrode and the second electrode of the capacitor reaches the threshold voltage of the drive element and the drive element is turned OFF, and (iii) to start supply of the corrected signal voltage to the first electrode of the capacitor by placing the first switching element in the ON state while the second switching element is kept in the OFF state, in the state where the capacitor is holding the corresponding-voltage.

According to the present aspect, it is possible to cause the capacitor to hold the corresponding-voltage that corresponds to the threshold voltage of the drive circuit.

In an organic EL display device according to a fifth aspect, the control unit is configured (i) to cause a predetermined signal voltage to be generated in the first electrode of the capacitor, by supplying the corrected signal voltage to the capacitor by placing the first switching element in the ON state in the state where the capacitor is holding the corresponding-voltage, the predetermined signal voltage being obtained by adding, to the corresponding-voltage, a voltage obtained when a voltage value of the corrected signal voltage is divided in accordance with a ratio between a capacitance of the capacitor and a capacitance of the second capacitor, and (ii) to subsequently cause the current to flow to the light-emitting element by supplying the predetermined signal voltage between the gate electrode and the source electrode of the drive element by placing the third switching element in the ON state after placing the first switching element in the OFF state.

According to the present aspect, it is possible to cause, in the first electrode of the capacitor, the generation of a predetermined signal voltage obtained by adding, to the corresponding-voltage, a voltage obtained by dividing the voltage value of the corrected signal voltage according to the ratio of the capacitance of the capacitor and the capacitance of the second capacitor. Subsequently, current is caused to flow to the light-emitting element by supplying the predetermined signal voltage between the gate electrode and source electrode of the drive element.

The drive current that is provided by the drive element to the light-emitting element is a current corresponding to a voltage obtained by subtracting the threshold voltage of the drive element from the potential difference between the gate electrode and the source electrode of the drive element. Therefore, in this case, by providing the predetermined signal voltage between the gate electrode and the source electrode of the drive element, the drive current provided to the light-emitting element becomes a current that corresponds to a voltage obtained by subtracting the threshold voltage of the drive element from the predetermined signal voltage. As a result, variation of threshold voltage among drive elements included in the respective pixel units can be suppressed, and thus correction precision in the low gradation region of the representative voltage-luminance characteristics can be enhanced.

In an organic EL display device according to a sixth aspect, a voltage value of the first standard voltage is set in advance so that a potential difference between a first electrode and a second electrode of the light-emitting element when the first standard voltage is applied to the first electrode of the capacitor is a voltage lower than a threshold voltage of the light-emitting element at which the light-emitting element starts to emit light.

According to the present aspect, the voltage value of the first standard voltage is set so that the light-emitting element does not emit light when the first standard voltage (a fixed voltage) is applied to the first electrode of the capacitor. With this, it is possible to prevent the light-emitting element from emitting light during standard voltage application, and thus the drive element can be kept in a reset state.

In an organic EL display device according to a seventh aspect, the corresponding-voltage that corresponds to the threshold voltage is a voltage such that current is smaller than a current which flows when the threshold voltage is applied to the gate electrode of the drive element.

According to the present aspect, a voltage for which current is smaller than the current which flows when the threshold voltage is applied to the gate of the drive element is added to the corrected signal voltage, and thus correction precision in the low gradation region of the representative voltage-luminance characteristics can be enhanced.

In an organic EL display device according to an eight aspect, the corresponding-voltage that corresponds to the threshold voltage is a voltage having a voltage value that is proportional to a voltage value of the threshold voltage and smaller than the voltage value of the threshold voltage.

According to the present aspect, the corresponding-voltage that corresponds to the threshold voltage is a voltage having a voltage value that is proportional to the voltage value of the threshold voltage and is smaller than the voltage value of the threshold voltage.

In other words, the voltage that the capacitor is holding is not the threshold voltage value itself but a voltage value that is smaller than the value of the threshold voltage. As such, the low gradation region of the representative voltage-luminance characteristics corresponds to a voltage region that is smaller than the threshold voltage. With this, a value smaller than the voltage value of the threshold voltage is added to the corrected signal voltage, and thus the correction precision in the low gradation region of the representative voltage-luminance characteristics can be enhanced.

In an organic EL display device according to a ninth aspect, the corresponding-signal voltage that corresponds to the single gradation level belonging to the high gradation region of the representative voltage-luminance characteristics is a voltage corresponding to a gradation level that is 20% to 100% of a maximum gradation level that can be displayed by each of the pixel units.

According to the present aspect, a voltage corresponding to a gradation level that is 20% to 100% of the maximum gradation level is applied as the signal voltage corresponding to one gradation level belonging to the high gradation region of the representative voltage-luminance characteristics.

In an organic EL display device according a tenth aspect, the corresponding-signal voltage that corresponds to the single gradation level belonging to the high gradation region of the representative voltage-luminance characteristics is a voltage corresponding to a gradation level that is 30% of a maximum gradation level that can be displayed by each of the pixel units.

According to the present aspect, a voltage corresponding to a gradation level that is 30% of the maximum gradation level is applied as the signal voltage corresponding to one gradation level belonging to the high gradation region of the representative voltage-luminance characteristics. This case allows for maximum suppression of correction error in the high gradation region.

In an organic EL display device according to an eleventh aspect, a corresponding-signal voltage that corresponds to a single gradation level belonging to an intermediate gradation region of the representative voltage-luminance characteristics is a voltage corresponding to a gradation level that is 10% to 20% of a maximum gradation level that can be displayed by each of the pixel units.

According to the present aspect, a voltage corresponding to one gradation level belonging to a gradation region that is 10% to 20% of the maximum gradation level is applied as the signal voltage corresponding to one gradation level belonging to the high gradation region of the representative voltage-luminance characteristics.

In an organic EL display device according to a twelfth aspect, the representative voltage-luminance characteristics are voltage-luminescence characteristics of a single pixel unit among the pixel units included in the display panel.

According to the present aspect, the representative voltage-luminance characteristics can be set as the voltage-luminance characteristics of a single arbitrary pixel unit among the pixel units included in the display panel.

In an organic EL display device according to a thirteenth aspect, the representative voltage-luminance characteristics are characteristics obtained by averaging voltage-luminescence characteristics of two or more pixel units among the pixel units included in the display panel.

According to the present aspect, the representative voltage-luminance characteristics are set in common throughout the entire display panel including the pixels, and can be calculated by averaging the voltage-luminance characteristics of the respective pixels included in the display panel. With this, since the correction parameter is calculated so that the luminance of each of the pixels included in the display panel becomes the representative voltage-luminance characteristics common throughout the entire display panel, using such correction parameter to correct the image signal allows the luminance of the light emitted by the respective pixels to be evened-out.

In an organic EL display device according to a fourteenth aspect, in the obtaining, the display panel is divided into segments, and the representative voltage-luminance characteristics are set for each of the segments, the representative voltage-luminance characteristics being common among the pixels included in each of the segments, and in the calculating, the correction parameter with which the luminance emitted when the subject pixel is caused to emit light according to the predetermined signal voltage becomes a standard luminance is calculated for the subject pixel, the standard luminance being obtained when the predetermined signal voltage is inputted to the function of the representative voltage-luminance characteristics for the segment including the subject pixel unit.

According to the present aspect, the display panel is divided into segments, and representative voltage-luminance characteristics common among the pixels included in each of the segments are set on a per segment basis. Subsequently, the correction parameter is calculated so that the luminance when a pixel is caused to emit light according to the predetermined signal voltage becomes the luminance obtained when the predetermined signal voltage is inputted to the function of the representative voltage-luminance characteristics for the segment including the pixel.

With this, it is possible, for example, to correct only a segment in which luminance unevenness occurs because luminance change between adjacent pixels is severe, and thus it is possible to calculate a correction parameter with which the luminance change between the adjacent pixels becomes smooth.

In an organic EL display device according to a fifteenth aspect, the measuring device is an image sensor.

In an organic EL display device according to a sixteenth aspect, the storage unit is configured to store only a gain out of the gain and offset which are correction parameters for correcting in accordance with characteristics of each of the pixel units.

A method of manufacturing an organic electroluminescence (EL) display device according to a seventeenth aspect includes: obtaining a function of representative voltage-luminance characteristics common throughout a display panel including pixel units each of which includes a light-emitting element, a drive element which is voltage-driven and controls supply of current to the light-emitting element, and a capacitor having a first electrode connected to a gate electrode of the drive element and a second electrode connected to one of a source electrode and a drain electrode of the drive element; causing the capacitor included in a subject pixel unit to hold a corresponding-voltage that corresponds to the threshold voltage of the drive element, the subject pixel unit being a current pixel unit to be processed among the pixel units included in the display panel; applying, to the drive element included in the subject pixel unit, a corresponding-signal voltage that corresponds to a single gradation level belonging to a high gradation region of the representative voltage-luminance characteristics, in the state where the capacitor is holding the corresponding-voltage, and measuring, using a predetermined measuring device, luminance emitted by the subject pixel unit; calculating, for each of the pixel units, a correction parameter with which the luminance of the subject pixel unit measured in the measuring becomes a luminance obtained when the corresponding-signal voltage is inputted to the function of the representative voltage-luminance characteristics; and storing the correction parameter calculated in the calculating, in a storage unit, in association with the subject pixel unit, in the calculating, a voltage is calculated, the voltage being a voltage such that the luminance emitted when the subject pixel unit is caused to emit light according to the corresponding-signal voltage is the standard luminance, and the correction parameter is a gain indicating a ratio between the corresponding-signal voltage and the calculated voltage.

Embodiment

Hereinafter, an embodiment of the present invention shall be described with reference to the Drawings.

Figure 4:
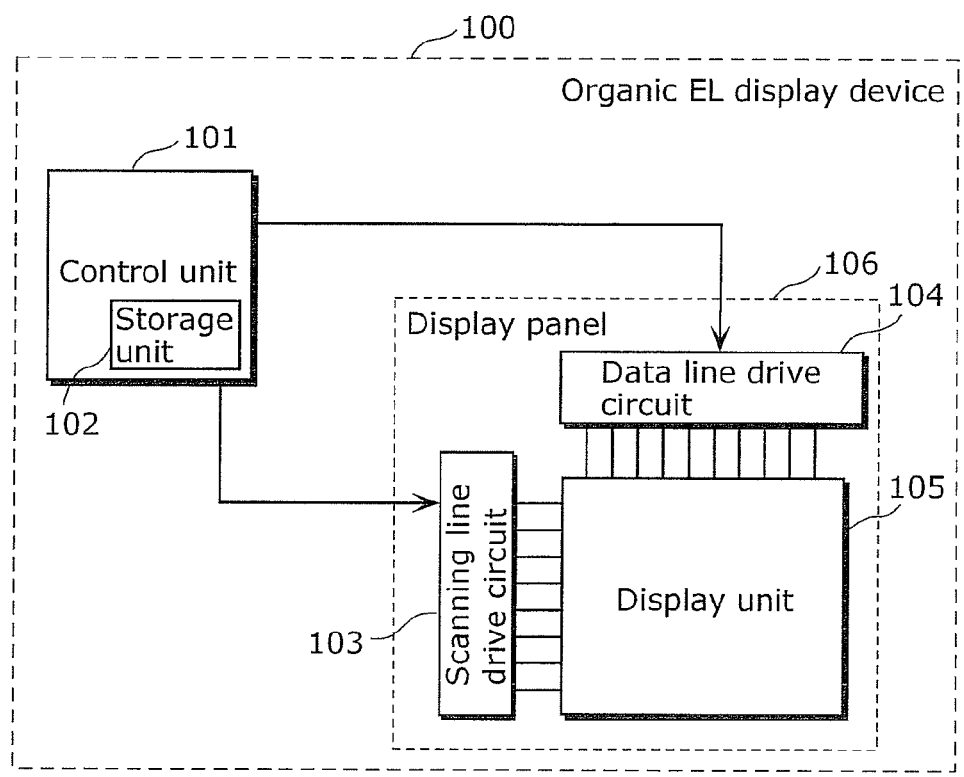
FIG. 4 is a block diagram showing a configuration of an organic EL display device in an embodiment of the present invention.

FIG. 4 is a block diagram showing a configuration of an organic EL display device in an embodiment of the present invention.

An organic EL display device 100 shown in FIG. 4 is a device which displays images using light-emitting elements, and includes a control unit 101 and a display panel 106.

The display panel 106 includes a display unit 105, a scanning line drive circuit 103, and a data line drive circuit 104, and displays images on the display unit 105 based on signals inputted to the scanning line drive circuit 103 and the data line drive circuit 104 from the control unit 101.

The display unit 105 includes pixel units 40 (not shown) which are arranged in a matrix. Here, a Vth compensation circuit which compensates (suppresses) the variation in the threshold voltage Vth of the TFT included in the pixel unit 40 is configured in each of the pixel units 40.

The control unit 101 includes a storage unit 102, controls image signals for displaying on the display panel 106, and causes the display panel 106 to display images. The control unit 101 reads a correction parameter (gain) corresponding to each of the pixel units 40, and obtains a corrected signal voltage by multiplying or dividing the image signal corresponding to each of the pixel units 40 by the read correction parameter (gain). It should be noted that the control unit 101 shall be described in detail later.

The storage unit 102 stores, for the respective pixel units 40, the correction parameters (gain) for correcting the image signal inputted from an external source in accordance with the characteristics of the respective pixel units 40.

Figure 5:
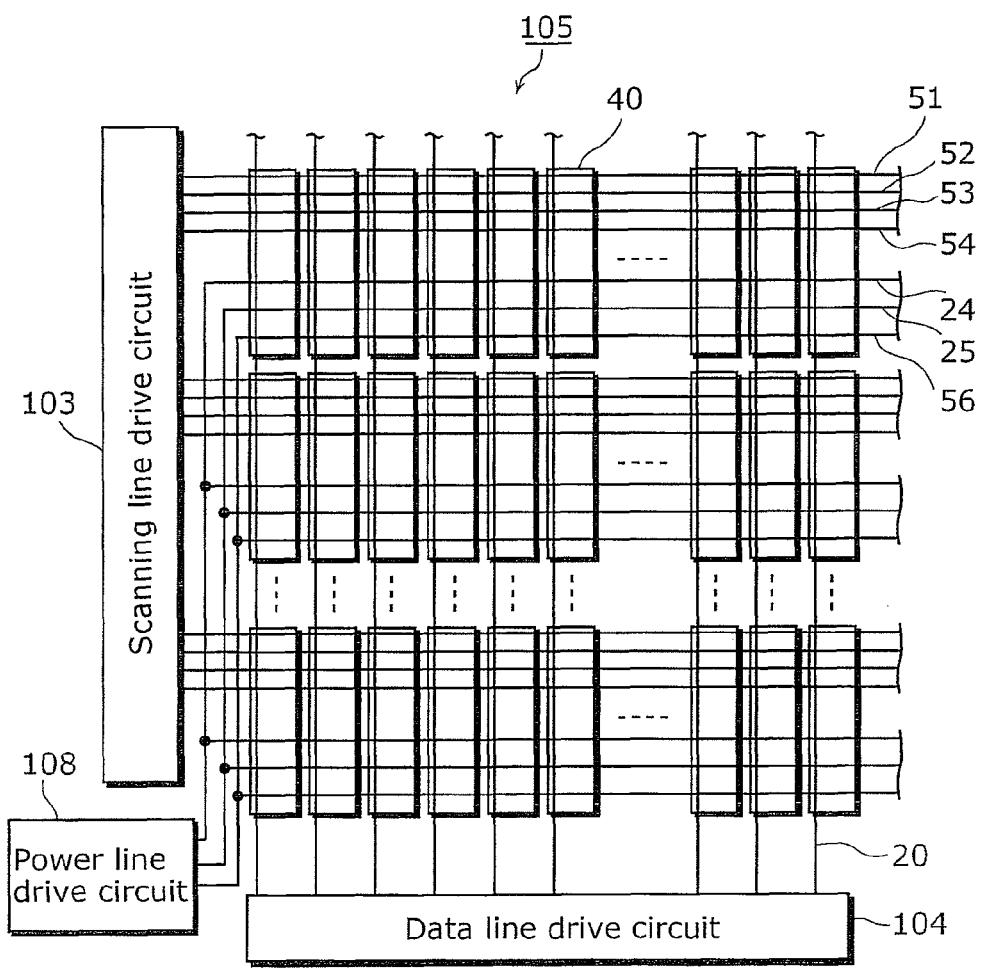
FIG. 5 is a schematic diagram showing a configuration of the organic EL display device in the present embodiment.

FIG. 5 is a schematic diagram showing a configuration of the organic EL display device in the present embodiment.

As shown in FIG. 5, the organic EL display device 100 includes the pixel units 40 which are arranged in, for example, a n×m matrix, the scanning line drive circuit 103, the data line drive circuit 104, and a power line drive circuit 108. The scanning line drive circuit 103 supplies the pixel units 40 with a scanning signal Scn, a reset signal Rst, a merge signal Mrg, and a detection trigger signal Trg.

The power line drive circuit 108 supplies power to the pixel units 40.

The scanning line drive circuit 103 supplies the scanning signal Scn to each of the pixel units 40 arranged in the row direction in FIG. 5, via the scanning line 51 connected in common to such pixel units 40. Likewise, the scanning line drive circuit 103 supplies the reset signal Rst to each of the pixel units 40 arranged in the row direction via a reset line 52 connected in common to such pixel units 40. Likewise, the scanning line drive circuit 103 supplies the merge signal Mrg to each of the pixel units 40 arranged in the row direction via a merge line 53 connected in common to such pixel units 40. Likewise, the scanning line drive circuit 103 supplies the detection trigger signal Trg to each of the pixel units 40 arranged in the row direction via a detection trigger line 54 connected in common to such pixel units 40.

Furthermore, the data line drive circuit 104 supplies a data signal Data (signal voltage) to each of the pixel units 40 arranged in the column direction in FIG. 5 via a data line 20 connected in common to such pixel units 40. It should be noted that, in the present embodiment, it is assumed that the scanning lines 51, the reset lines 52, the merge lines 53, and the detection trigger lines 54 are n lines in number, and the data lines 20 are m lines in number.

The power line drive circuit 108 supplies power to a high-voltage-side power line 24 and a low-voltage-side power line 25 which are connected in common to all of the pixel units 40. Furthermore, the power line drive circuit 108 supplies a standard voltage (reference voltage) to a standard-voltage power line 56 connected in common to all the pixel units 40.

It should be noted that although description is carried out in the present embodiment with the standard voltage being 0 (v) to facilitate description, the present invention is not limited to such standard voltage.

Figure 6:
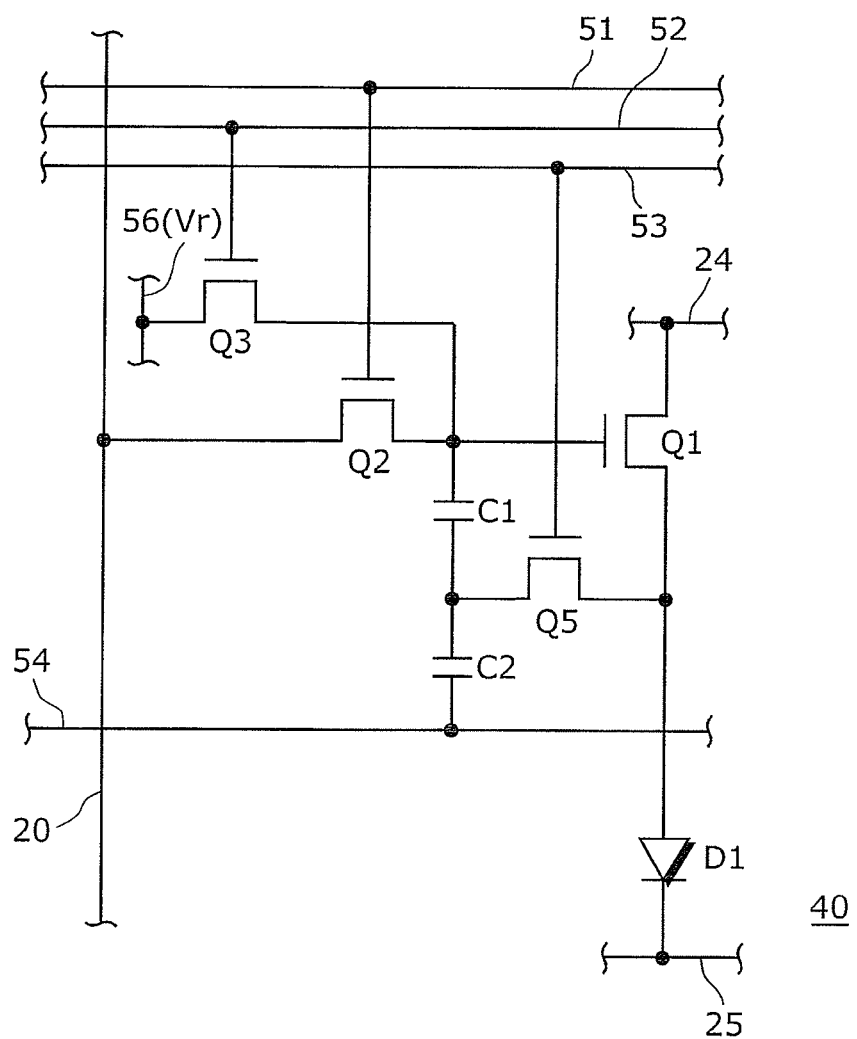
FIG. 6 is a circuit diagram for a pixel unit in the present embodiment.

FIG. 6 is a circuit diagram for a pixel unit in the present embodiment.

The pixel unit 40 shown in FIG. 6 is one pixel included in the display unit 105 and has a function of emitting light according to the signal voltage (data signal Data) supplied via the data line 20. Furthermore, a Vth compensation circuit, which compensates (suppresses) the variation in the threshold voltage Vth of the TFT characteristics, is configured in each of the pixel units 40. The pixel unit 40 includes an organic EL element D1, a drive transistor Q1, a holding capacitor C1, a switching transistor Q2 which is a write switch, a reference transistor Q3, a isolation transistor Q5, and a detection trigger capacitor C2. Furthermore, the following are connected to the pixel unit 40: the data line 20 for supplying signal voltage; the high-voltage-side power line 24 for determining the potential of a drain electrode of the drive transistor Q1; the low-voltage-side power line 25 which is connected to a second electrode of the organic EL element D1; the scanning line 51; the reset line 52; the merge line 53; the detection trigger line 54; and the standard-voltage power line 56 for supplying a first standard voltage which defines the voltage value of a first electrode of the holding capacitor C1.

The organic EL element D1 functions as a light-emitting element, and emits light according to the drive current of the drive transistor Q1. The organic EL element D1 has a cathode (second electrode) connected to the low-voltage-side power line 25, and an anode (first electrode) connected to a source (source electrode) of the drive transistor Q1. Here, the voltage supplied by the low-voltage-side power line 25 is denoted by Vs, and is for example 0 (v).

The drive transistor Q1 is a voltage-driven drive element which controls the supply of current to the organic EL element D1, and causes the organic EL element D1 to emit light by supplying current to the organic EL element D1. The drive transistor Q1 has a gate (gate electrode) connected to the data line 20 via the switching transistor Q2, a source (source electrode) connected to an anode (first electrode) of the organic EL element D1, and a drain (drain electrode) connected to the high-voltage-side power line 24. Here, the voltage supplied to the high-voltage-side power line 24 is denoted as Vdd, and is, for example, 20 (v). With this, the drive transistor Q1 converts the signal voltage (data signal Data) supplied to its gate into a signal current corresponding to the signal voltage (data signal Data), and supplies the signal current obtained from the conversion to the organic EL element D1.

The holding capacitor C1 holds the voltage which determines the amount of current to be supplied by the drive transistor Q1. Specifically, the holding capacitor C1 is connected between the source (low-voltage-side power line 25) of the drive transistor Q1 and the gate of the drive transistor Q1. Stated differently, the holding capacitor C1 has a first electrode connected to the gate electrode of the drive transistor Q1 and a second electrode connected to the source electrode of the drive transistor Q1. The holding capacitor C1 has, for example, a function of maintaining the immediately preceding signal voltage and causing drive current to be continuously supplied from the drive transistor Q1 to the organic EL element D1, even after the switching transistor Q2 switches to the OFF state. It should be noted that, in actuality, the holding capacitor C1 holds an electric charge obtained by multiplying a signal voltage by a capacitance.

The switching transistor Q2, which corresponds to the first switching element in the present invention, has one terminal connected to the data line 20 and the other terminal connected to the first electrode of the holding capacitor C1, and switches between conduction and non-conduction between the data line 20 and the holding capacitor C1. Specifically, the switching transistor Q2 has a function for writing, in the holding capacitor C1, a signal voltage (data signal Data) that is in accordance with the image signal (corrected signal voltage). The switching transistor Q2 has a gate connected to the scanning line 51, and one of a source and a drain connected to the data line 20. In addition, the switching transistor Q2 has a function of controlling the timing for supplying the signal voltage (data signal Data) of the data line 20 to the gate of the drive transistor Q1. Stated differently, the switching transistor Q2 is a writing switch for writing, in the holding capacitor C1, a voltage that is in accordance with the image signal (corrected signal voltage).

The reference transistor Q3, which corresponds to the second switching element in the present invention, has one terminal connected to the standard-voltage power line 56 and the other terminal connected to the first electrode of the holding capacitor C1, and switches between conduction and non-conduction between the standard-voltage power line 56 and the holding capacitor C1. Specifically, the reference transistor Q3 has a function of providing a standard voltage (Vr) to the gate of the drive transistor Q1, during the detection of the threshold voltage Vth of the drive transistor Q1. The reference transistor Q3 has one of a drain and a source connected to the gate of the drive transistor Q1, and the other of the drain and the source connected to the standard-voltage power line 56 for applying a reference voltage (Vr). Furthermore, the reference transistor Q3 has a gate connected to the reset line 52. Stated differently, the reference transistor Q3 is a reference switch for providing a standard voltage (reference voltage) to the gate (gate electrode) of a drive transistor Q1, during the detection of threshold voltage Vth (or a corresponding-voltage that corresponds to the threshold voltage Vth) of the drive transistor Q1.

The isolation transistor Q5, which corresponds to the third switching element in the present invention, has one terminal connected to the source electrode of the drive transistor Q1 and the other terminal connected to the second electrode of the holding capacitor C1, and switches between conduction and non-conduction between the source electrode of the drive transistor Q1 and the second electrode of the holding capacitor C1. Specifically, the isolation transistor Q5 has a function of isolating the holding capacitor C1 from the drive transistor Q1 during a write period in which voltage is written into the holding capacitor C1. The isolation transistor Q5 has one of a drain and a source connected to the source of the drive transistor Q1, and the other of the drain and the source connected to the second electrode of the holding capacitor C1. Furthermore, the isolation transistor Q5 has a gate connected to the merge line 53. Stated differently, the isolation transistor Q5 is a isolation switch for isolating the holding capacitor C1 from the source (source electrode) of the drive transistor Q1 during a write period in which voltage is written into the holding capacitor C1.

The detection trigger capacitor C2 corresponds to the second capacitor in the present invention, and has a first electrode connected to the second electrode of the holding capacitor C1. Specifically, the detection trigger capacitor C2 has a first electrode connected to the second electrode of the holding capacitor C1, and the source of the drive transistor Q1 is connected between the first electrode of the detection trigger capacitor C2 and the second electrode of the holding capacitor C1. Furthermore, a second electrode of the detection trigger capacitor C2 is connected to detection trigger line 54. In addition, the detection trigger capacitor C2 has a function of dividing the voltage to be applied to the first electrode of the holding capacitor C1. For example, when a signal voltage (VData) is applied to the gate of the drive transistor Q1 from the data line 20, a voltage resulting from the division of the signal voltage (VData) according to the ratio between the capacitances of the holding capacitor C1 and the detection trigger capacitor C2 is applied to the holding capacitor C1.

The detection trigger line 54, which corresponds to the bias voltage line in the present invention, is connected to the second electrode of the detection trigger capacitor C2 and causes, in the second electrode of the holding capacitor C1, the generation of a second standard voltage which is lower than a value obtained from subtracting the threshold voltage of the drive transistor Q1 from the first standard voltage. Specifically, the detection trigger line 54 supplies a voltage for reducing a source voltage Vs of the drive transistor Q1, in order to detect the threshold voltage Vth (or the corresponding-voltage that corresponds to the threshold voltage Vth) of the drive transistor Q1.

Thus, the pixel unit 40 is configured as described above.

It should be noted that each of the drive transistor Q1, the switching transistor Q2, the reference transistor Q3, and the isolation transistor Q5 included in the pixel unit 40 is, for example, an N-channel thin-film transistor or an enhancement transistor. Of course, these transistors may be channel thin-film transistors, or depression transistors.

Figure 7:
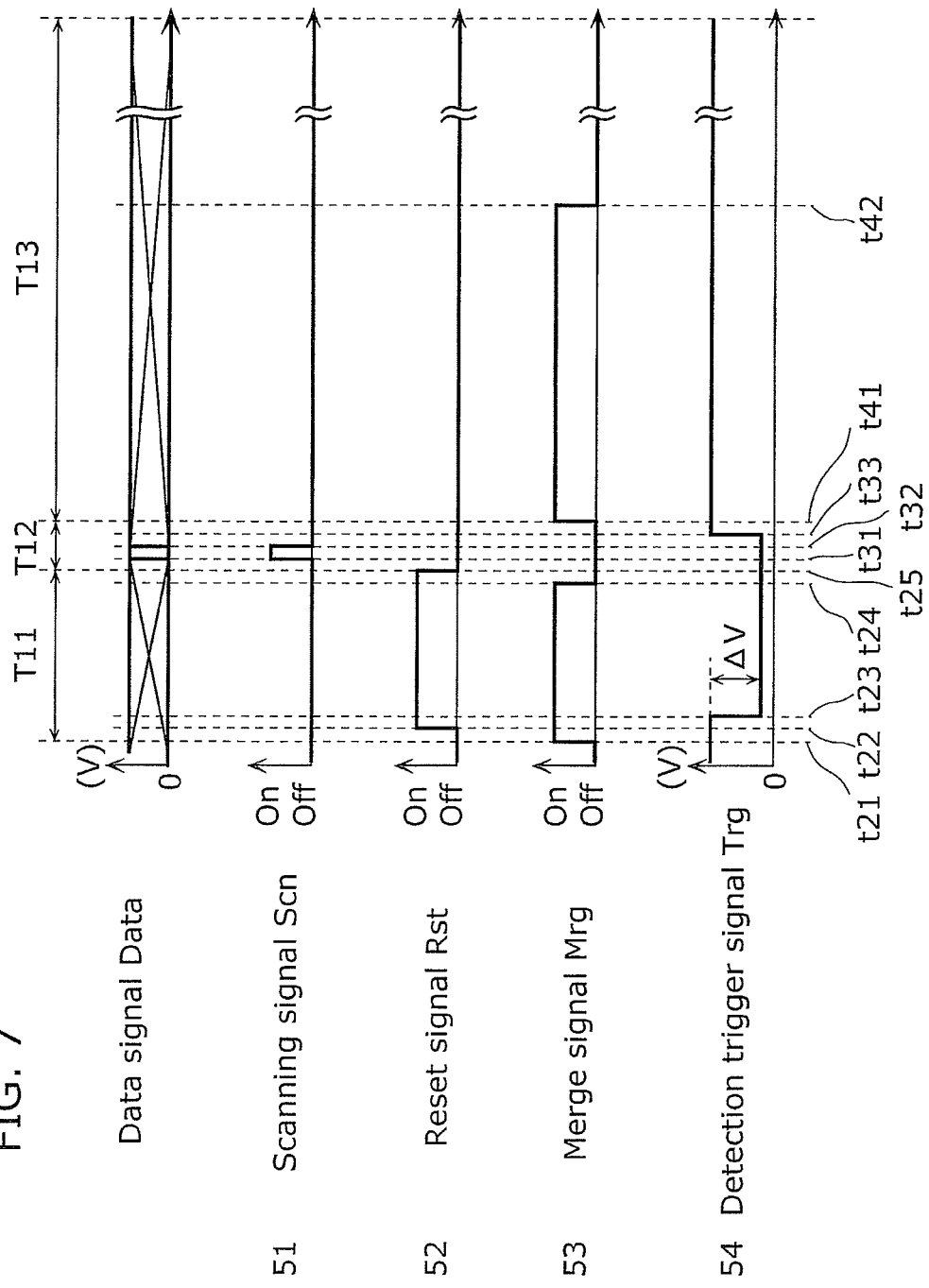
FIG. 7 is a timing chart showing operations of the pixel unit in the embodiment of the present invention.

Next, operations of the pixel unit 40 in the present embodiment shall be described. FIG. 7 is a timing chart showing the operations of a pixel unit in the embodiment of the present invention.

The control unit 101 performs, in each of the pixel units 40 and within a certain measurement period, the operation for detecting the threshold voltage Vth of the drive transistor Q1, the operation for writing a signal voltage (data signal Data) corresponding to the image signal (corrected signal voltage) into the holding capacitor C1, and the operation for causing the organic EL element D1 to emit light according to the voltage written into the holding capacitor C1. Details of the operations shall be described under the assumption that the period for detecting the threshold voltage Vth of the drive transistor Q1 is a Vth detection period T11, the period for writing the signal voltage (data signal Data) corresponding to the image signal (corrected signal voltage) into the holding capacitor C1 is a write period T12, and the period for causing the organic EL element D1 to emit light based on the voltage written into the holding capacitor C1 is a light-emission period T13. It should be noted that the Vth detection period T11, the write period T12, and the light-emission period T13 are defined for each of the pixel units 40, and the phases of the aforementioned three periods need not match for all the pixel units 40.

(Vth Detection Period T11)

Figure 8:
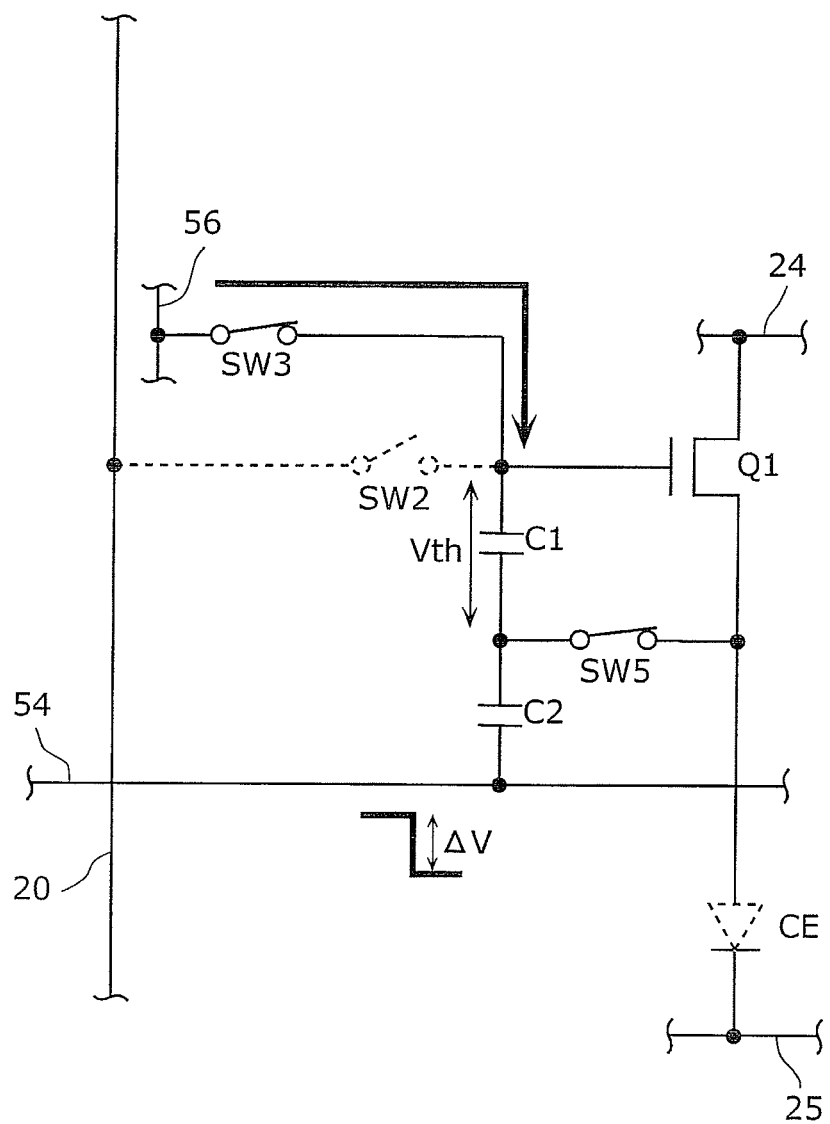
FIG. 8 is a diagram for describing the operation in a Vth detection period T11 of a pixel unit in the embodiment of the present invention.

FIG. 8 is a diagram for describing the operation in the Vth detection period T11 of a pixel unit in the embodiment of the present invention. It should be noted that, for the sake of description, the switching transistor Q2, the reference transistor Q3, and the isolation transistor Q5 in FIG. 6 are replaced in FIG. 8 by a switch SW2, a reference switch SW3, and a isolation switch SW5, respectively. Furthermore, the organic EL element D1 is replaced by a capacitor CE.

At an initial time t21 of the Vth detection period T11, a merge signal Mrg supplied to the merge line 53 is set to a high level so as to place the isolation switch SW5 (isolation transistor Q5) into the ON state. Here, in addition, at the time t21 of the Vth detection period T11, a reset signal Rst supplied to the reset line 52 is at the low level, and thus the reference switch SW3 (reference transistor Q3) is in the ON state.

Next, at a time t22, the reset signal Rst is set to the high level so as to place the reference switch SW3 into the ON state.

Then, the standard voltage Vr (here, 0 V) is applied to the gate of the drive transistor Q1 via the reference switch SW3, and thus the drive transistor Q1 is turned ON. Therefore, current does not flow to the organic EL element D1, and the organic EL element D1 functions as the capacitor CE. Furthermore, the source voltage Vs of the drive transistor Q1 becomes an OFF voltage VEoff of the organic EL element D1.

It should be noted that the voltage value of the standard voltage Vr is not limited to 0 V. It is sufficient that the voltage value of the standard voltage Vr be set in advance so that, when the standard voltage Vr is applied to the first electrode of the holding capacitor C1, the potential difference between the first electrode and second electrode of the organic EL element D1 is a voltage that is lower than the threshold voltage of the organic EL element D1 at which the organic EL element D1 starts to emit light. Setting in this manner is done because it can prevent the organic EL element D1 from emitting light, and it can keep the drive transistor Q1 in the reset state.

Subsequently, at a time t23, the detection trigger signal Trg is lowered by as much as the voltage ΔV. Then, the source voltage Vs of the drive transistor Q1 drops by as much as the voltage obtained by dividing the voltage ΔV using the capacitance of the detection trigger capacitor C2 and the combined capacitance of the holding capacitor C1 and the capacitor CE. Here, the source voltage Vs is as shown in (Equation 1)

$$Vs = VEoff - (C2/(C1+C2+CE)) \cdot \Delta V \quad \text{(Equation 1)}$$

As a result, the gate-source voltage Vgs of the drive transistor Q1 becomes equal to or greater than the threshold voltage Vth, and thus the drive transistor Q1 turns ON.

Specifically, during the Vth detection period T11, the control unit 101 causes a first standard voltage Vr to be applied to the first electrode of the holding capacitor C1 by turning ON the reference transistor Q3 in a state where the isolation transistor Q5 is turned ON after turning OFF the switching transistor Q2, and causes a potential difference that is greater than the threshold voltage of the drive transistor Q1 to be generated in the holding capacitor C1 by applying a second standard voltage (−ΔV) to the second electrode of the detection trigger capacitor C2.

Subsequently, the drive transistor Q1 turns ON, the electric charges of the holding capacitor C1 and the capacitor CE are discharged together with the charging of the detection trigger capacitor C2, and the source voltage Vs begins to rise. In addition, the drive transistor Q1 turns OFF at the point in time when the gate-source voltage Vgs and the threshold voltage Vth (or the corresponding-voltage that corresponds to the threshold voltage Vth) of the drive transistor Q1 become equal.

Specifically, the source voltage Vs of the drive transistor Q1 is as shown in (Equation 2), and the voltage VC1 of the holding capacitor C1 becomes equal to the threshold voltage Vth.

$$Vs = -Vth \quad \text{(Equation 2)}$$

In this way, the threshold voltage Vth (or the corresponding-voltage that corresponds to the threshold voltage Vth) is held in the holding capacitor C1, the detection capacitor C2, and the capacitor CE.

In other words, the control unit 101 performs a Vth compensation operation in which the voltage held by the holding capacitor C1 becomes the threshold voltage Vth (or the corresponding-voltage that corresponds to the threshold voltage Vth). More specifically, after allowing the passage of time up to when the potential difference between the first electrode and second electrode of the holding capacitor C1 reaches the threshold voltage of the drive transistor Q1 and the drive transistor Q1 turns OFF, the control unit 101 performs a Vth compensation operation to cause the corresponding-voltage that corresponds to the threshold voltage of the drive transistor Q1 to be held in the holding capacitor C1 by turning OFF the reference transistor Q3 and the isolation transistor Q5.

Subsequently, at a time t24 in which the Vth compensation operation ends, that is, the pixel unit 40 Vth detection period T11 ends, the merge signal Mrg is set to the low level so as to place the isolation switch SW5 (isolation transistor Q5) into the OFF state. In addition, at a time t25, the reset signal Rst is set to the low level so as to place the reference switch SW3 into the OFF state.

It should be noted that, in the Vth detection period T11, the scanning signal Scn supplied to the scanning line 51 is at the low level, and the switch SW2 (switching transistor Q2) is in the OFF state.

Moreover, the above-described threshold voltage Vth is synonymous to the corresponding-voltage that corresponds to the threshold voltage Vth, and such corresponding-voltage is ideally equal to the threshold voltage Vth and is normally a value smaller than the threshold voltage Vth.

Here, the reason why the voltage held by the holding capacitor C1 is a voltage corresponding to a voltage that is normally lower than Vth in the Vth compensation operation shall be described.

Figure 9:
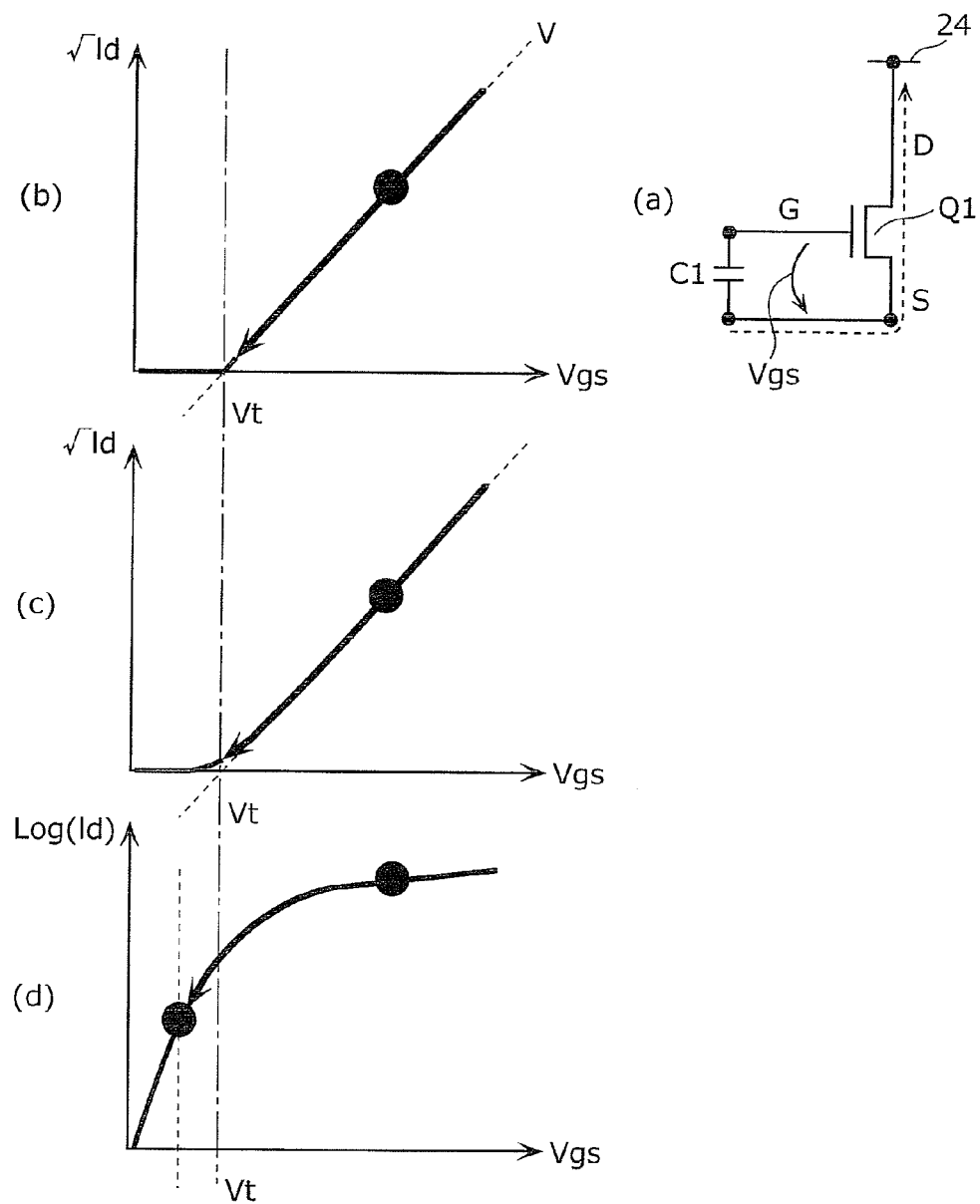
FIG. 9 is a diagram for describing the voltage held by a holding capacitor after the Vth detection.

FIG. 9 is a diagram for describing the voltage held by the holding capacitor after Vth detection. Here, (a) in FIG. 9 is a graph selectively illustrating the drive transistor Q1 and the holding capacitor C1. In (a) in FIG. 9, illustration of the isolation transistor Q5 is omitted since the isolation transistor Q5 is turned ON during the Vth detection period. Since the voltage applied to the holding capacitor C1 is the gate-source voltage of the drive transistor Q1, it shall be described as Vgs.

It is assumed that, for example, a voltage (VA) that is higher than the threshold voltage Vth of the drive transistor Q1 is applied to the holding capacitor C1 shown in (a) in FIG. 9. Then, the holding capacitor C1 discharges the held electric charge to the Vdd-side through the TFT channel of the drive transistor Q1. Then, since the current flowing in the TFT channel of the drive transistor Q1 smaller when the potential between the electrodes of the holding capacitor C1 becomes small, that is, when the voltage Vgs applied to the holding capacitor C1 becomes small, the discharging takes time.

Here, as shown in (b) in FIG. 9, in the ideal case where the current of the drive transistor Q1 does not flow when the voltage applied to the drive transistor Q1 is equal to or lower than the threshold voltage Vth, current no longer flows when the potential between the electrodes of the holding capacitor C1 becomes Vth. As such, the threshold voltage Vth of the drive transistor Q1 is maintained in the holding capacitor C1.

However, in actuality, there are variations in the TFT characteristics of the drive transistor Q1. As such, as shown in (c) in FIG. 9, a minute current flows even when the voltage applied to the drive transistor Q1 is equal to or lower than the threshold voltage Vth, and thus a voltage that is equal to or lower than the threshold voltage Vth of the drive transistor Q1 is held in the holding capacitor C1. In other words, as shown in (d) in FIG. 9, in actuality, current flows in such a manner as to decrease exponentially when the voltage applied to the drive transistor Q1 is equal to or lower than the threshold voltage Vth. As such, a potential that is equal to or lower than Vth is held in the holding capacitor C1 for a predetermined set time.

Therefore, in the Vth compensation operation, the voltage held by the holding capacitor C1 has a voltage value that is proportional to the voltage value of the threshold voltage Vth and smaller than the voltage value of the threshold voltage Vth.

Stated differently, the corresponding-voltage that corresponds to the threshold voltage is a gate voltage for which current is smaller than the current which flows between the source and drain when the signal voltage for which the threshold voltage has been compensated is applied to the gate of the drive transistor Q1.

It should be noted that although it is described that the drive transistor Q1 is, for example, an enhancement N-channel thin-film transistor and the corresponding-voltage that corresponds to the threshold voltage normally has a value that is smaller than the threshold voltage Vth in the above description, they are not limited to such. As described above, the drive transistor Q1 may be, for example, a depression N-channel thin-film transistor, or it may be an enhancement P-channel thin-film transistor or a depression P-channel thin-film transistor.

For example, in the case of a depression N-channel thin-film transistor, the voltage held by the holding capacitor C1 has a voltage value that becomes bigger in the minus-side than the voltage value of the threshold voltage Vth, and thus although the numerical value itself becomes smaller, the absolute value of the voltage becomes bigger. Furthermore, for example, in the case of an enhancement P-channel thin-film transistor, the voltage held by the holding capacitor C1 has a voltage value that is closer to the plus-side than the voltage value of the threshold voltage Vth, and thus, although the value, as an absolute value, becomes smaller, the numerical value itself becomes bigger.

In other words, no matter which of the above types of thin-film transistor is used, it can be said that the above described corresponding-voltage that corresponds to the threshold voltage is the gate voltage for which current becomes smaller than the current which flows when the threshold voltage is applied to the gate of the drive transistor Q1.

(Write Period T12)

Figure 10:
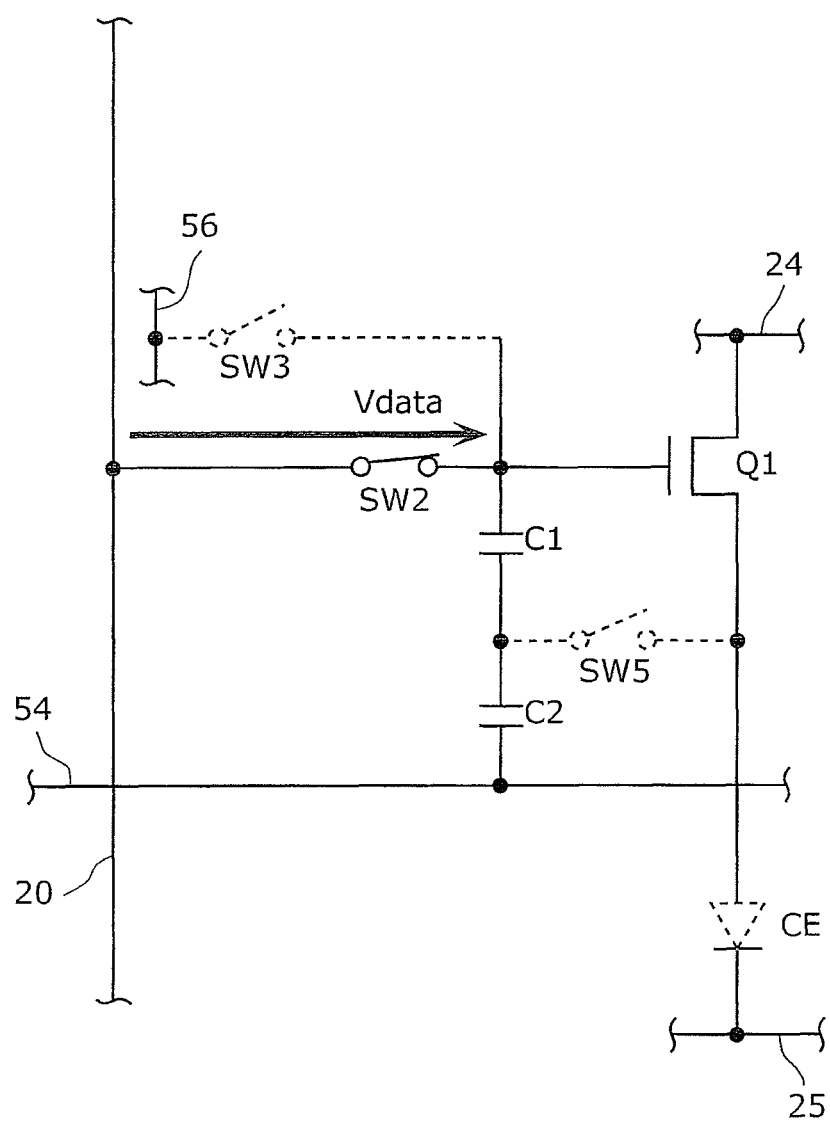
FIG. 10 is a diagram for describing the operation in a write period T12 of a pixel unit in the embodiment of the present invention.

FIG. 10 is a diagram for describing the operation in the write period T12 of a pixel unit in the embodiment of the present invention.

At a time t31 in the write period T12, the scanning signal Scn is set to the high level so as to place the switch SW2 into the ON state. Then, signal voltage Vdata corresponding to the image signal (corrected signal voltage) supplied to the data line 20 at this time is applied to the drive transistor Q1. It should be noted that although the control unit 101 supplies the image signal to the data line 20 as described above, such image signal is a corrected signal voltage obtained by multiplying or dividing the image signal by the correction parameter in the storage unit 102.

As such, the voltage VC1 of the holding capacitor C1 increases by as much as the voltage obtained by dividing the capacitance of the signal voltage Vdata between the holding capacitor C1 and the detection trigger capacitor C2, and becomes as shown in (Equation 3).

In other words, the voltage VC1 applied to the holding capacitor C1 assumes a magnitude that is equal to or greater than the threshold voltage Vth of the drive transistor Q1. Specifically, the control unit 101 supplies the corrected signal voltage to the holding capacitor C1 by turning ON the switching transistor Q2 in a state where the holding capacitor C1 is holding the corresponding-voltage that corresponds to the threshold voltage. With this, the control unit 101 causes, in the first electrode of the holding capacitor C1, the generation of a predetermined signal voltage which is obtained by adding, to the corresponding-voltage that corresponds to the threshold voltage, the voltage obtained by dividing the voltage value of the corrected signal voltage according to the ratio of the capacitance of the holding capacitor C1 and the capacitance of the detection trigger capacitor C2.

$$VC1 = Vth + (C2/(C1+C2)) \cdot Vdata \quad \text{(Equation 3)}$$

Subsequently, at a time t32 in which the write operation of the pixel unit 40 ends, the scanning signal Scn is returned to the low level so as to place the switch SW2 into the OFF state. At a subsequent time t33, the detection trigger signal Trg is returned to the original voltage.

As described above, the control unit 101 performs the write operation of starting the supply of the image signal (corrected signal voltage) to the first electrode of the holding capacitor C1 by turning ON the switching transistor Q2 while the reference transistor Q3 is kept OFF, in the state where the holding capacitor C1 is holding the corresponding-voltage that corresponds to the threshold voltage Vth.

(Light-Emission Period 13)

Figure 11:
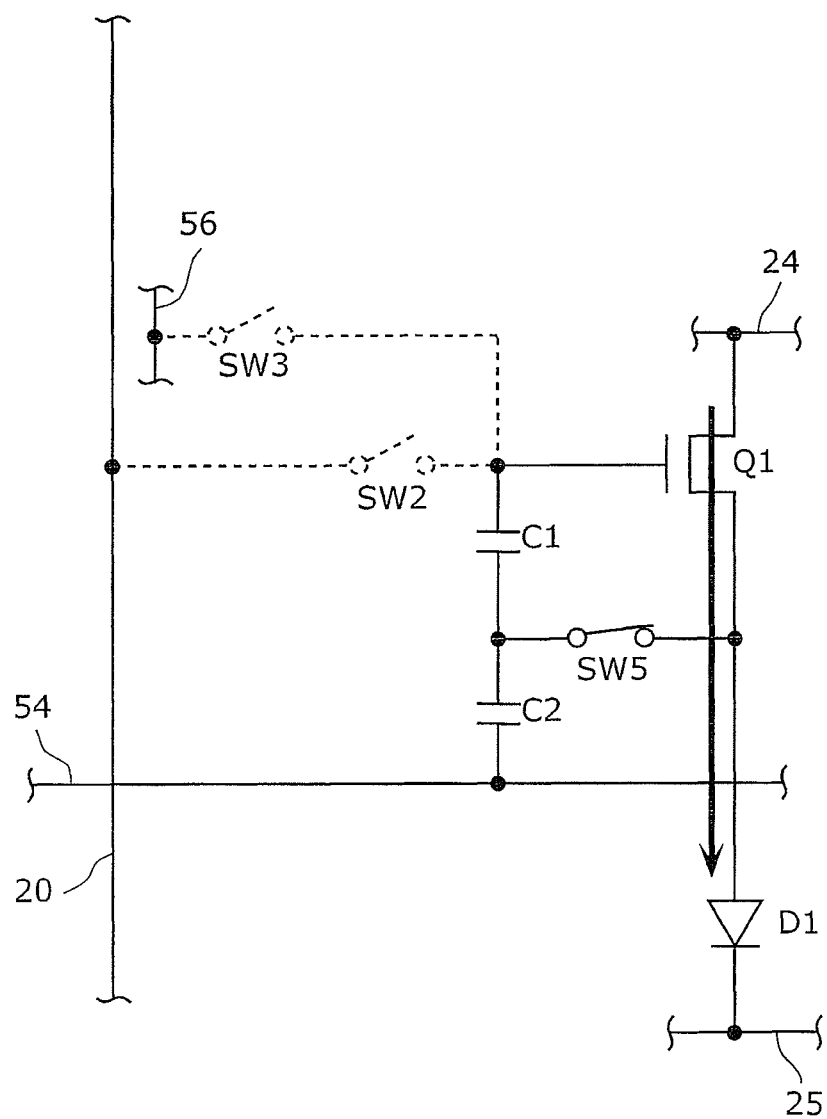
FIG. 11 is a diagram for describing the operation in a light-emission period T13 of a pixel unit in the embodiment of the present invention.

FIG. 11 is a diagram for describing the operation in the light-emission period T13 of a pixel unit in the embodiment of the present invention.

At a time t41 of the light-emission period T13, a merge signal Mrg is set to the high level so as to place the isolation switch SW5 (isolation transistor Q5) into the ON state. Here, in the light-emission period T13, the scanning signal Scn supplied to the scanning line 51 is at the low level, and the switch SW2 (switching transistor Q2) is in the OFF state. Furthermore, in the light-emission period T13, the reset signal Rst supplied to the reset line 52 is at the low level, and the reference switch SW3 (reference transistor Q3) is in the OFF state.

Then, the voltage VC1 of the holding capacitor C1 becomes the gate-source voltage Vgs of the drive transistor Q1. In the write period T12, a voltage that is equal to or greater than the threshold voltage Vth and is a voltage (corresponding-voltage) that corresponds to the threshold voltage Vth is stored as the voltage VC1, and thus a current that is in accordance with the signal voltage Vdata corresponding to the image signal flows in the drive transistor Q1, and the organic EL element D1 is caused to emit light at a luminance that is in accordance with the image signal.

In this manner, by turning ON the isolation transistor Q5 after turning OFF the switching transistor Q2, the control unit 101 supplies a predetermined signal voltage obtained from the corresponding-voltage and the corrected signal voltage, between the gate electrode and the source electrode of the drive transistor Q1, and provides current to the organic EL element D1. The current Ipx1 flowing to the organic EL element D1 at this time is as shown in (Equation 4), and is not affected by the threshold voltage Vth (or the corresponding-voltage that corresponds to the threshold voltage Vth).

$$Ipx1 = (\beta/2) \cdot (Vgs - Vth)^2 \quad \text{(Equation 4)}$$
$$= (\beta/2) \cdot ((C2/(C1+C2)) \cdot Vdata)^2$$

Here, β is a coefficient that is determined depending on the mobility μ of the drive transistor Q1, a gate insulation film capacitance Cox, a channel length L, and a channel width W, and is as shown in (Equation 5).

$$\beta = \mu \cdot Cox \cdot (W/L) \quad \text{(Equation 5)}$$

It should be noted that, when the isolation switch SW5, that is, the isolation transistor Q5 is placed into the ON state before hand in the light-emission period T13, the threshold voltage of the isolation transistor Q5 changes and ON characteristics deteriorate. As such, it is preferable that the merge signal Mrg be set at the low level and the switch SW5 be set in the OFF state in a time t42 in which the source potential of the drive transistor Q1 is sufficiently charged at the connection node between the holding capacitor C1 and the detection trigger capacitor C2. It should be noted that, even when the switch SW5 is placed in the OFF state, the voltage of the respective units does not change, and thus there is no effect on the light-emission by the organic EL element D1.

As described above, with each writing of a corresponding image signal (corrected signal voltage) into the respective pixel units 40, the control unit 101: causes the holding capacitor C1 included in the respective pixel units 40 to detect the threshold voltage of the drive transistor Q1; then after the detection of the threshold voltage, causes the holding capacitor C1 to hold the corresponding-voltage that corresponds to the threshold voltage of the drive transistor Q1; supplies the corrected signal voltage to the holding capacitor C1 in the state where the holding capacitor C1 is holding the corresponding-voltage; and causes the organic EL element D1 to emit light by causing current to flow to the organic EL element D1 by supplying, between the gate and source electrodes of the drive transistor Q1, a predetermined signal voltage obtained by adding to or subtracting from the corresponding-voltage the corrected signal voltage.

With this, it is possible to cause, in the first electrode of the holding capacitor C1, the generation of the predetermined signal voltage which is obtained by adding, to the corresponding-voltage, the voltage obtained by dividing the voltage value of the corrected signal voltage according to the ratio of the capacitance of the holding capacitor C1 and the capacitance of the detection trigger capacitor C2. In addition, it is possible to cause current to flow to the organic EL element D1 by supplying the predetermined signal voltage between the gate electrode and the source electrode of the drive transistor Q1. Here, the drive current that is provided by the drive transistor Q1 to the organic EL element D1 is a current corresponding to a voltage obtained by subtracting the threshold voltage of the drive transistor Q1 from the potential difference between the gate electrode and the source electrode of the drive transistor Q1. Therefore, by supplying the predetermined signal voltage between the gate electrode and the source electrode of the drive transistor Q1, the current flowing to the organic EL element D1 becomes a current corresponding to a voltage obtained by subtracting the threshold voltage of the drive transistor Q1 from the predetermined signal voltage. As a result, it is possible to perform the Vth compensation for suppressing variation of threshold voltages between the drive transistors Q1 included in the respective pixel units 40.

Furthermore, the term for the threshold voltage Vth is not included in the current Ipx1 flowing to the organic EL element D1. Therefore, even when the threshold voltage Vth of the drive transistor Q1 fluctuates according to change over time, the current Ipx1 flowing to the organic EL element D1 is not affected and it is possible to cause the organic EL element D1 to emit light at a luminance corresponding to the image signal.

As described above, the Vth compensation circuit is configured in the pixel unit 40.

Furthermore, since the luminance of the organic EL element D1 is determined according to the voltage of the holding capacitor C1, it is necessary to perform driving such that the voltage of the holding capacitor C1 does not cause unexpected fluctuation. As such, by controlling the respective transistors based on the sequence shown in FIG. 7, it is possible to reliably control the voltage of the holding capacitor C1.

As described above, in the organic EL display device 100, Vth compensation is performed for each of the pixel units 40 through the Vth compensation circuit configured in each of the pixel units 40.

Figure 12:
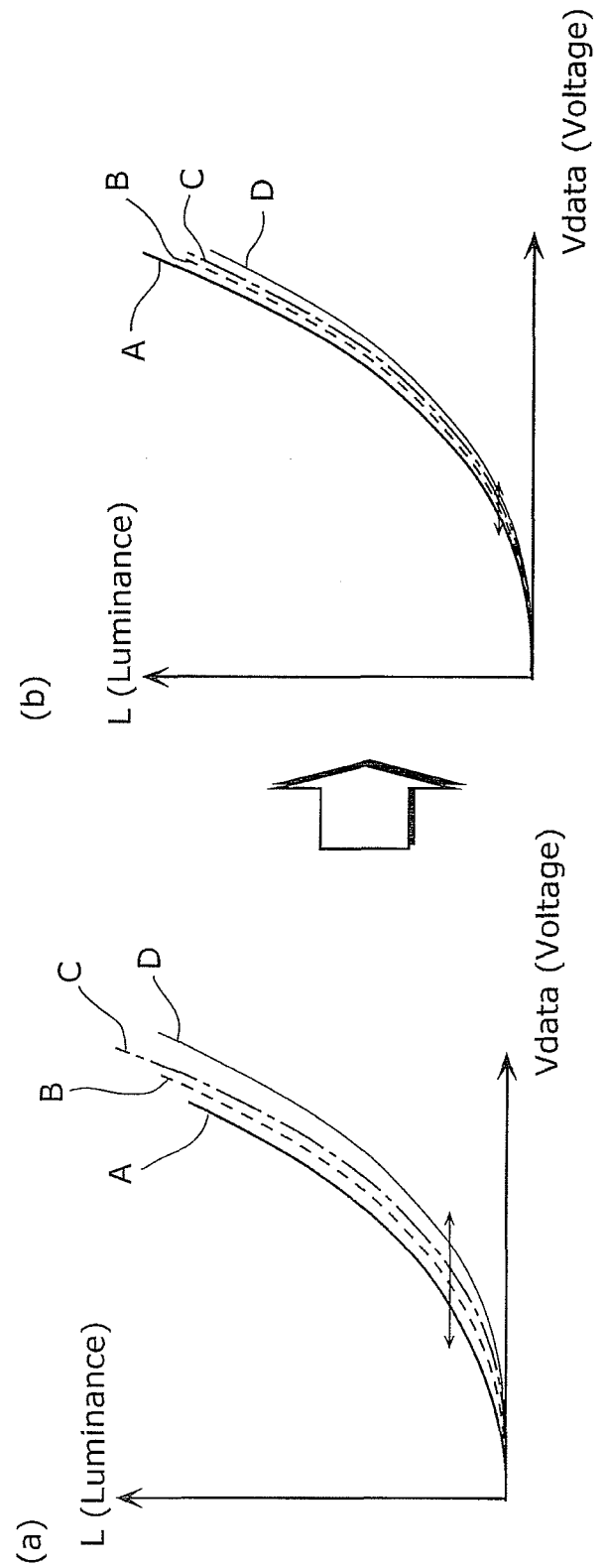
FIG. 12 is a diagram for describing results of Vth compensation in the embodiment of the present invention.

FIG. 12 is a diagram for describing results of the Vth compensation in the embodiment of the present invention. (a) in FIG. 12 is a graph showing the voltage-luminance characteristics of pixel units 40 when Vth compensation is not performed, and (b) in FIG. 12 is a graph showing the voltage-luminance characteristics of pixel units 40 after Vth compensation. It should be noted that FIG. 12 illustrates, for example, four pixel units 40 (A to D).

In the organic EL display device 100, there are variations in the threshold voltage Vth in the TFT included in the respective pixel units 40. As such, when some type of correction such as Vth compensation and the like is not performed, the voltage-luminance characteristics of the pixel units 40 in A to D do not match and show variations, as shown in (a) in FIG. 12. In contrast, when Vth compensation is performed by the Vth compensation circuit configured in each of the pixel units 40, the voltage-luminance characteristics of the pixel units 40 in A to D are uniform for the luminance in the low gradation region. This is the same even when the threshold voltage Vth fluctuates due to change over time. However, there is variation in luminance in the high gradation region.

In this manner, Vth compensation is performed for the respective pixel units 40 with the writing of a corresponding image signal (compensated signal voltage) into the respective pixel units 40 by the control unit 101. In addition, such Vth compensation functions as an offset for correcting, to a predetermined standard luminance, the luminance of the organic EL element D1 corresponding to the image signal supplied to the respective pixel units 40.

However, since there is variation in the luminance in high gradation region, luminance unevenness corresponding to variation remains in the display of the organic EL display device 100. For this reason, as described below, a correction parameter (gain) is stored in advance in the storage unit 102 included in the control unit 101. Subsequently, the luminance measurement for each pixel is performed in order to obtain the correction parameter (gain) to be stored in advance in the storage unit 102, that is, the correction parameter (gain) for correcting, to a predetermined standard luminance, the luminance of the organic EL element D1 which corresponds to the image signal supplied to the respective pixel units 40. Here, offset is not obtained as a correction parameter because this is compensated in the Vth compensation.

Hereinafter, a method for obtaining the gain which is the correction parameter shall be described.

Figure 13:
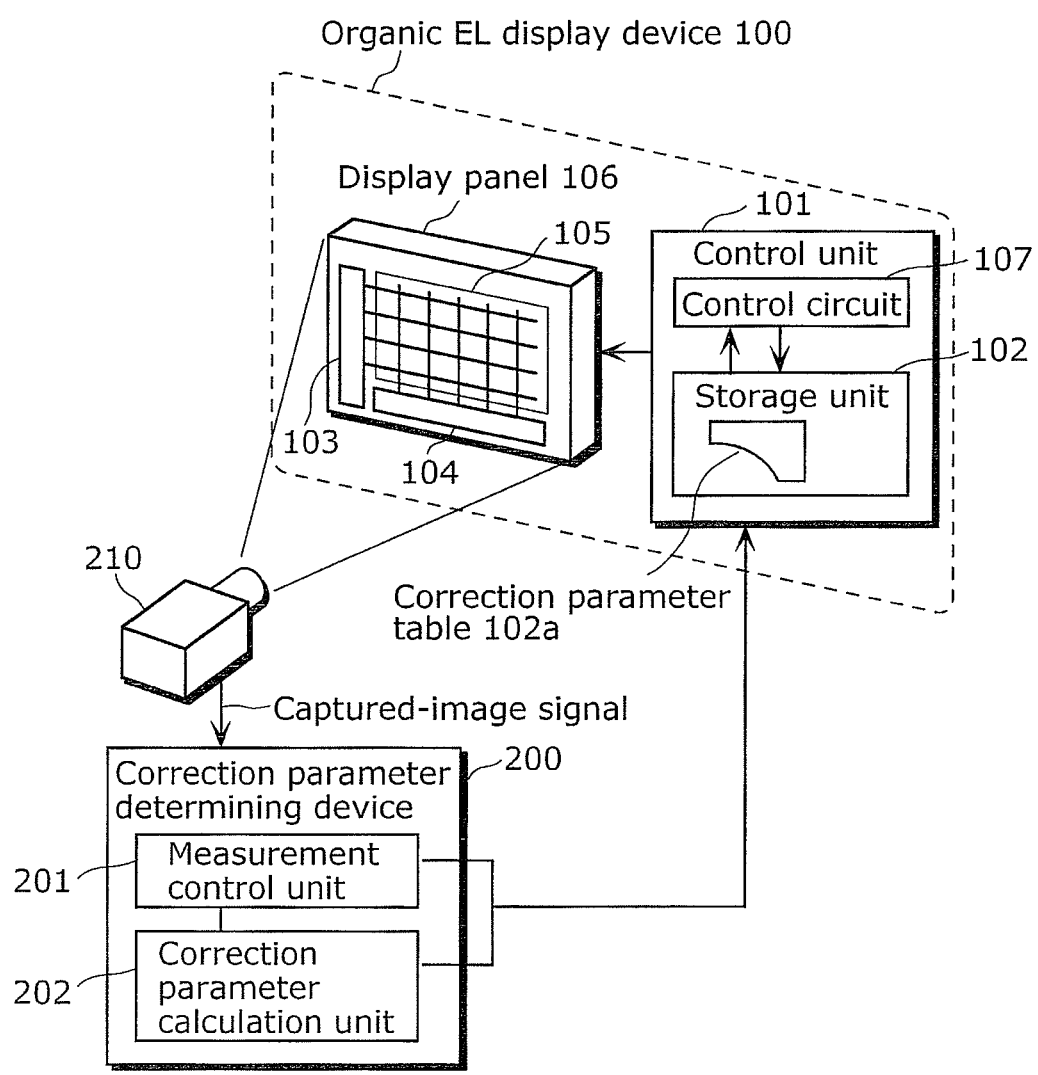
FIG. 13 is a diagram showing a configuration of a luminance measurement system at the time of luminance measurement of the display panel.

FIG. 13 is a diagram showing a configuration of a luminance measurement system at the time of luminance measurement for a display panel.

Luminance measurement for the display panel 106 is performed on the display panel 106 of the organic EL display device 100, by using a measuring device 210. In addition, in the present system configuration, the luminance unevenness in the display panel 106 can be reduced while shortening the luminance measurement time, as described later.

The luminance measurement system shown in FIG. 13 includes the organic EL display device 100, a correction parameter determining device 200, and the measuring device 210, and is intended to perform luminance measurement on the display panel 106 of the organic EL display device 100 and obtain gain which is the correction parameter.

The organic EL display device 100 includes the control unit 101 and the display panel 106.

As described earlier, the display panel 106 includes the display unit 105, the scanning line drive circuit 103, and the data line drive circuit 104, and displays images on the display unit 105 based on signals inputted to the scanning line drive circuit 103 and the data line drive circuit 104 from the control unit 101.

The control unit 101 includes the storage unit 102 and a control circuit 107, and has a function of supplying image signals for displaying on the display panel 106, and causing the display panel 106 to display images, by controlling the scanning line drive circuit 103 and the data line drive circuit 104. Specifically, the control unit 101 causes the pixel units 40 included in the display panel 106 to emit light, according to an instruction from a measurement control unit 201. Furthermore, the control unit 101 further writes, into the storage unit 102, the correction parameter (gain) for each of the pixel units 40 calculated by a correction parameter calculation unit 202.

Figure 15:
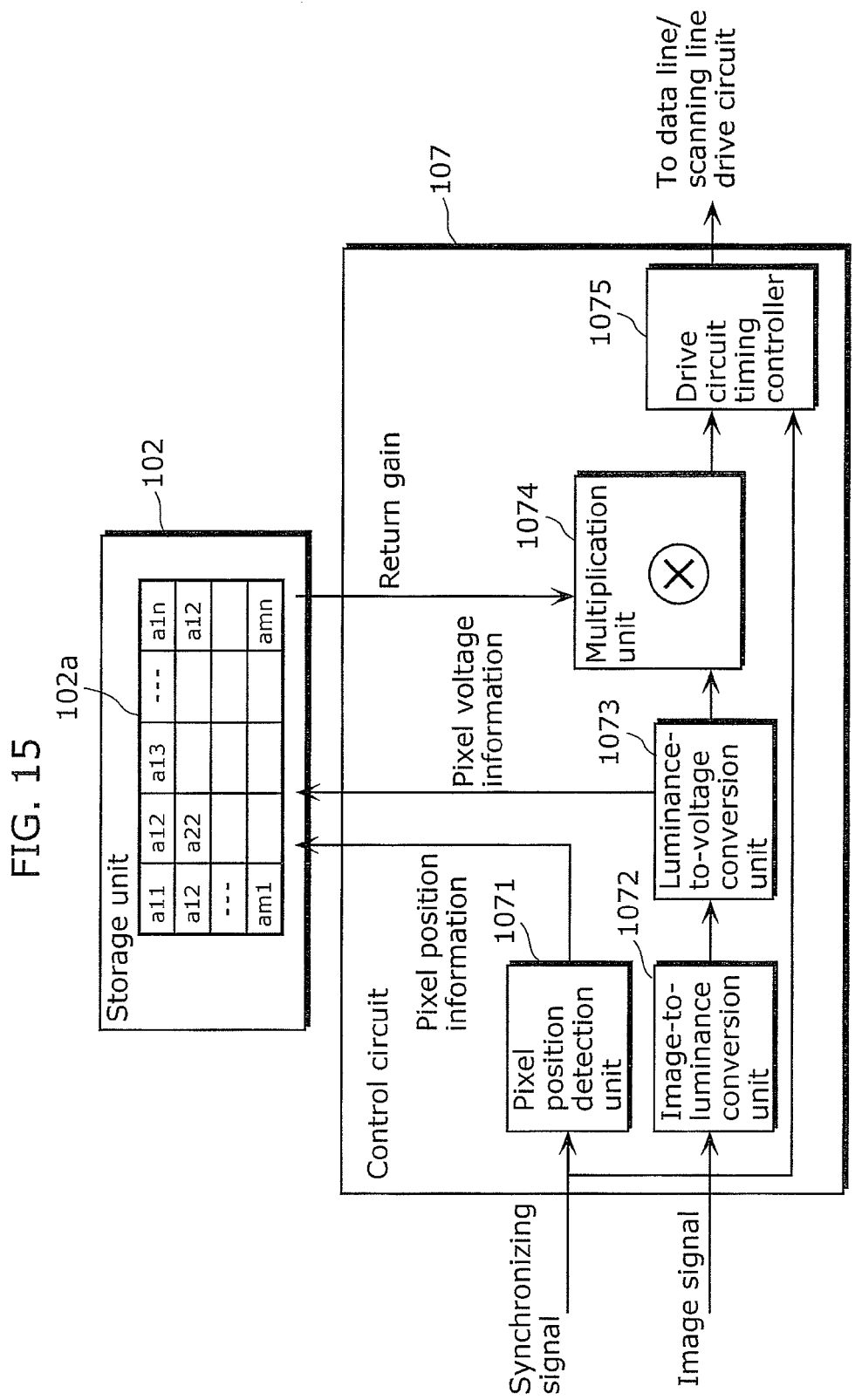
FIG. 15 is a diagram showing an example of a function configuration diagram for a control unit in the present embodiment.

FIG. 14 is a table showing an example of a correction parameter table held by the storage unit in the present embodiment. FIG. 15 is a diagram showing an example of a function configuration diagram for the control unit in the present embodiment.

The storage unit 102 stores, for each of the pixel units 40, the correction parameter (gain) for correcting the image signal inputted from an external source, in accordance with the characteristics of each of the pixel units 40. Specifically, the storage unit 102 stores a correction parameter table 102a including the correction parameter (gain) for each of the pixel units 40.

As shown in FIG. 14, the correction parameter table 102a is a data table which includes the correction parameter (gain) for each of the pixel units 40. In FIG. 14, the correction parameters (gain) are denoted by a11 to amn, that is, the correction parameter table 102a stores a correction parameter indicating gain for each of the pixel units 40, in correspondence with the matrix of the display unit 105 (m rows×n columns).

Here, Vth compensation is also performed at the time of luminance measurement of the display panel 106, and the correction parameter (gain) is calculated by performing luminance measurement of the display panel 106 in the Vth-compensated, that is, in the offset state.

As shown in FIG. 15, the control circuit 107 includes a pixel position detection unit 1071, an image-to-luminance conversion unit 1072, a luminance-to-voltage conversion unit 1073, a multiplication unit 1074, and a drive circuit timing controller 1075.

The pixel position detection unit 1071 detects, according to a synchronizing signal inputted simultaneously with the image signal inputted from the external source, the pixel position information of the image signal. Here, it is assumed that the detected pixel position is x row and y column.

The image-to-luminance conversion unit 1072 converts the image signal inputted from the external source into a luminance signal, and outputs the luminance signal to the luminance-to-voltage conversion unit 1073. The image-to-luminance conversion unit 1072 has, for example, an image-to-luminance conversion LUT stored in a memory, and converts the image signal inputted from the external source into a luminance signal by reading the luminance signal corresponding to the image signal.

The luminance-to-voltage conversion unit 1073 converts the luminance signal outputted from the image-to-luminance conversion unit 1072 into a voltage signal, and outputs the voltage signal to the multiplication unit 1074. The luminance-to-voltage conversion unit 1073 reads, for example, from a representative LUT derived based on a representative conversion curve stored in a memory, the voltage signal of the x row and y column corresponding to the luminance signal outputted from the image-to-luminance conversion unit 1072, and outputs the voltage signal to the multiplication unit 1074.

The multiplication unit 1074 corrects the voltage signal by multiplying the gain (here, the voltage gain) which is the correction parameter corresponding to each of the pixel units and which is stored in the storage unit 102, with the voltage signal. Specifically, a voltage gain axy of the x row and y column and the voltage signal value of the x row and y column are multiplied, and a corrected voltage signal of the x row and y column is generated. The multiplication unit 1074 outputs the corrected voltage signal to the drive circuit timing controller 1075.

It should be noted that the multiplication unit 1074 may correct the voltage signal by calculation other than multiplication, such as dividing the voltage gain corresponding to each of the pixel units and which is stored in the storage unit 102 in advance, by the voltage signal outputted from the luminance-to-voltage conversion unit 1073.

The drive circuit timing controller 1075 outputs the converted voltage signal of the x row and y column to the data line drive circuit 104. This voltage signal is converted to an analog voltage and inputted to the data line drive circuit 104, or is converted into an analog voltage inside the data line drive circuit 104. Subsequently, the analog voltage is supplied, as data voltage, from the data line drive circuit 104 to the respective pixels.

In this manner, the control unit 101 reads the correction parameter (gain) corresponding to the respective pixel units 40 from the storage unit 102, and obtains a corrected signal voltage by performing the calculation on the image signal corresponding to the respective pixel units 40 using the read correction parameter (gain). In addition, the control unit 101 causes the display panel 106 to display an image by outputting the corrected signal voltage obtained by calculation to the display panel 106.

The measuring device 210 is a measuring device which can measure luminance that is emitted by the pixel units 40 included in the display panel 106. Specifically, the measuring device 210 is an image sensor such as a charge coupled device (CCD) image sensor, and can precisely measure the luminance of all the pixel units 40 included in the display unit 105 of the display panel 106 in one image-capturing operation. It should be noted that the measurement unit 210 is not limited to an image sensor and may be any type of measuring device as long as it is capable of measuring the luminance of the pixel units 40 of the display unit 105.

The correction parameter determining device 200 includes the measurement control unit 201 and the correction parameter calculation unit 202. The correction parameter determining device 200 is a device which determines the correction parameter (gain) for correcting, to the standard luminance, the luminance of the pixel units 40 included in the display unit 105 of the display panel 106, based on the luminance of the respective pixel units 40 measured by the measuring device 210.

Furthermore, the correction parameter determining device 200 outputs the determined correction parameter (gain) to the control unit 101 of the organic EL display device 100. Here, the standard luminance is a luminance obtained when a predetermined voltage is inputted to the function of the representative voltage-luminance characteristics.

The measurement control unit 201 is a processing unit which measures the luminance emitted by the pixel units 40 included in the display panel 106.

Specifically, the measurement control unit 201 first obtains the function of the representative voltage-luminance characteristics that is common among the pixel units 40 included in the display panel 106. Here, the representative voltage-luminance characteristics are voltage-luminance characteristics that serve as a standard for making luminance uniform. For example, the representative voltage-luminance characteristics are the voltage-luminance characteristics of a pixel unit 40 in a predetermined position among the pixel units 40 included in the display panel 106. Furthermore, for example, the representative voltage-luminance characteristics are voltage-luminance characteristics obtained by averaging the voltage-luminance characteristics of two or more pixel units 40 among the pixel units 40 included in the display panel 106. It should be noted that, in this case, since the correction parameter is calculated so that the luminance of each of the pixel units 40 included in the display panel 106 assumes the representative voltage-luminance characteristics common throughout the entire display panel 106, using such correction parameters to correct the image signals produces the effect of being able to even out the luminance of the lights emitted by the respective pixel units 40. Furthermore, the function of the representative voltage-luminance characteristics is a function of the relationship between the signal voltage supplied to the drive transistor Q1 and the luminance emitted by the pixel unit 40 by way of the organic EL element D1. It should be noted that the function of the representative voltage-luminance characteristics is assumed to be determined in advance through a separate measurement and the like.

Furthermore, the measurement control unit 201 obtains the luminance by causing the control unit 101 to cause the pixel units 40 included in the display panel 106 to emit light, and causing the measuring device 210 to measure the luminance emitted by the pixel units 40.

Specifically, the measurement control unit 201 obtains the luminance by applying, to the drive transistor Q1 which is the drive element included in a pixel unit 40, a signal voltage corresponding to one gradation level belonging to a high gradation region (or an intermediate gradation region) of the representative voltage-luminance characteristics, in the state where the holding capacitor C1 included in the pixel unit 40 holds the corresponding-voltage that corresponds to the threshold voltage Vth (in the Vth-compensated state), and by measuring the luminance emitted by the pixel unit 40, using the predetermined measuring device 210.

Figure 16:
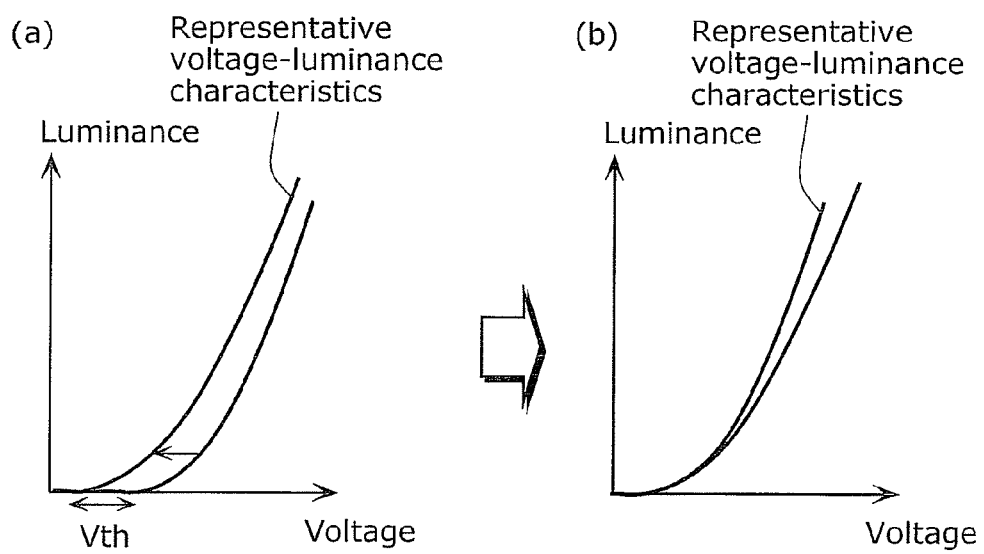
FIG. 16 is a diagram showing voltage-luminance characteristics of a predetermined pixel unit and representative voltage-luminance characteristics.

Here, the reason why the measurement control unit 201 measures a signal voltage corresponding to one gradation level belonging to either the intermediate gradation region or the high gradation region of the representative voltage-luminance characteristics shall be described. FIG. 16 shows the voltage-luminance characteristics of a predetermined pixel unit and the representative voltage-luminance characteristics. (a) in FIG. 16 shows the voltage-luminance characteristics of a predetermined pixel unit 40, and (b) in FIG. 16 shows voltage-luminance characteristics in the case of Vth compensation, that is, the case where the threshold voltage Vth of the drive transistor Q1 is added as the offset, in the predetermined pixel unit 40.

As shown in (b) in FIG. 16, when offset is added (Vth compensation is performed), the voltage-luminance characteristics of the predetermined pixel unit 40 and the representative voltage-luminance characteristics show close characteristics in the low gradation region of the representative voltage-luminance characteristics. In other words, by displaying luminance according to a voltage to which the offset has been added (on which Vth compensation has been performed), the voltage-luminance characteristics of the pixel units 40 show a matching state with the representative voltage-luminance characteristics in the low gradation region. On the other hand, in the high gradation region of the representative voltage-luminance characteristics, the voltage-luminance characteristics of the predetermined pixel unit 40 and the representative voltage-luminance characteristics do not show close characteristics. In other words, with the high gradation region of the representative voltage-luminance characteristics, there is a gap between both characteristics, and both show an unmatched state.

Therefore, since close characteristics are shown even when a signal voltage corresponding to one gradation level belonging to the low gradation region among the regions of the representative voltage-luminance characteristics is measured, the effect is not so significant. However, it is more effective when the measurement control unit 201 measures a signal voltage corresponding to one gradation level belonging to either the intermediate gradation region or the high gradation region among the regions of the representative voltage-luminance characteristics, and calculates the gain. Specifically, calculating the gain in the high gradation region of the representative voltage-luminance characteristics is effective because, aside from characteristics becoming close in the low gradation region due to the Vth compensation, it is also possible to bring the characteristics close even in the high gradation region.

The correction parameter calculation unit 202 calculates the correction parameter (gain) for a pixel, using the luminance obtained by the measurement control unit 201 and the function of the representative voltage-luminance characteristics. The correction parameter calculation unit 202 outputs the calculated correction parameter (gain) to the control unit 101. Subsequently, the control unit 101 stores the correction parameter (gain) in the storage unit 102.

Specifically, the correction parameter calculation unit 202 (i) obtains, by calculation, the voltage such that the luminance obtained by the measurement control unit 201, that is, the luminance when the pixel unit 40 is caused to emit light according to the corresponding signal voltage is the luminance obtained when the corresponding signal voltage is inputted to the function of the representative voltage-luminance characteristics, and calculates the correction parameter (gain) indicating the ratio between such corresponding signal voltage and the voltage obtained by calculation. Here, the corresponding signal voltage is the signal voltage applied to the drive transistor Q1 included in the pixel unit 40 in the state where the holding capacitor C1 included in the pixel unit 40 holds the above-described corresponding-voltage that corresponds to the threshold voltage Vth, and is the signal voltage corresponding to one gradation level belonging to the high gradation region of the representative voltage-luminance characteristics. In other words, the correction parameter (gain) is the ratio of the corresponding signal voltage to the voltage obtained in the case where the luminance when the pixel unit 40 is caused to emit light according to the corresponding signal voltage is inputted to the function of the representative voltage-luminance characteristics.

It should be noted that the correction parameter (gain) may be calculated as the ratio between the luminance when the pixel unit 40 is caused to emit light according to the corresponding signal voltage and the luminance (standard luminance) obtained when the corresponding signal voltage is inputted.

Furthermore, the correction parameter calculation unit 202 obtains the correction parameter for the respective colors, namely, the red color, green color, and blue color emitted by the organic EL element D1.

Here, the representative voltage-luminance characteristics, the high gradation region, and the low gradation region shall be described.

Figure 17:
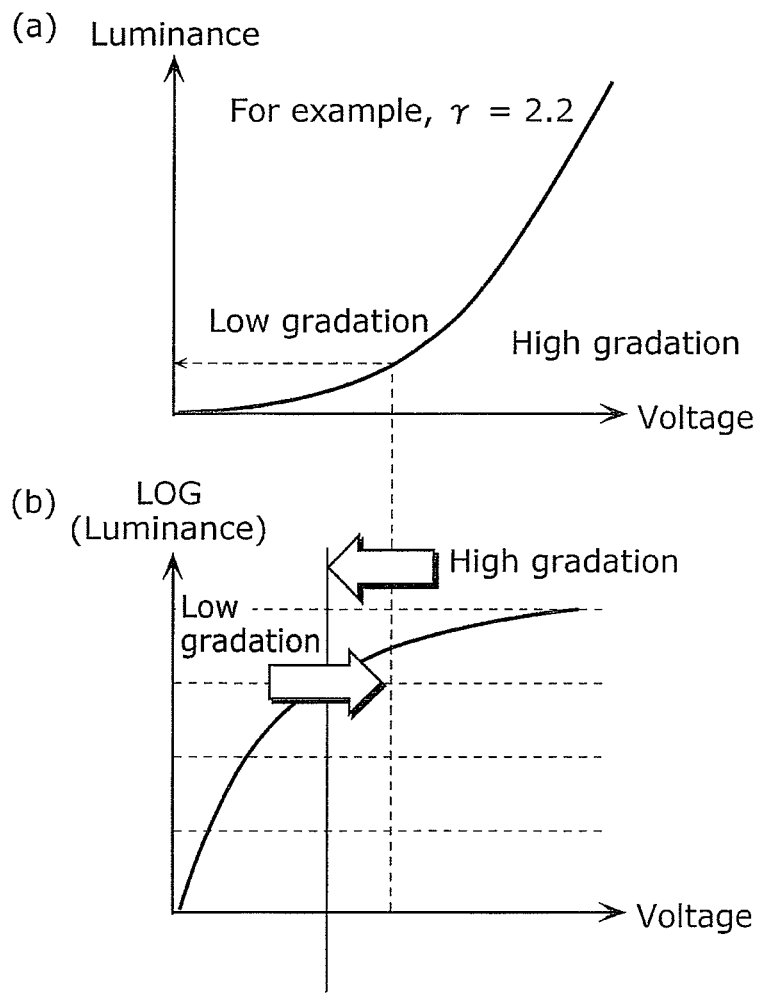
FIG. 17 is a diagram for describing the representative voltage-luminance characteristics, a high gradation region, and a low gradation region in the present embodiment.

FIG. 17 is a diagram for describing the representative voltage-luminance characteristics, the high gradation region, and the low gradation region in the present embodiment.

As shown in (a) in FIG. 17, the representative voltage-luminance characteristics show the characteristics represented by a curve in which the luminance emitted by the pixel unit 40 is proportional to the γ (gamma) power (for example, γ=2.2) of the voltage supplied to the drive transistor Q1.

In addition, the pixel units 40 included in the display panel 106 have respectively different voltage-luminance characteristics. As such, in the present embodiment, the representative voltage-luminance characteristics are assumed to be the voltage-luminance characteristics of a single arbitrary pixel among the pixel units 40 included in the display panel 106. It should be noted that the representative voltage-luminance characteristics are the characteristics set in common throughout the entirety of the display panel 106 including the pixel units 40, and may be the characteristics obtained by averaging the voltage-luminance characteristics of the respective pixel units 40 included in the display panel 106.

Furthermore, (b) in FIG. 17 shows the representative voltage-luminance characteristics that is in accordance with human visual sensitivity. Specifically, since the human eye has a sensitivity that is close to a LOG function, representative voltage-luminance characteristics that are in accordance with human visual sensitivity show characteristics in which luminance is represented by the curve of the LOG function.

As such, since the human eye does not easily recognize luminance unevenness in the high gradation regions and easily recognizes luminance unevenness in the low gradation regions, in order to adjust to human visual sensitivity, it is preferable to set the width of the high gradation region wide and the width of the low gradation region narrow.

Therefore, the signal voltage corresponding to one gradation level belonging to the high gradation region of the representative voltage-luminance characteristics is preferably a voltage corresponding to one gradation level that is 20% to 100% of the maximum gradation level that can be displayed by each of the pixel units 40, and is more preferably a voltage corresponding to one gradation level that is 30% of the maximum gradation level. This is because, this allows for maximum suppression of correction error in the high gradation region.

Furthermore, the signal voltage corresponding to one gradation level belonging to the intermediate gradation region of the representative voltage-luminance characteristics is preferably a voltage corresponding to a gradation level that is 10% to 20% of the maximum gradation level that can be displayed by each of the pixel units 40.

It should be noted that the one gradation level belonging to the low gradation region of the representative voltage-luminance characteristics is preferably a gradation level that is 0% to 10% of the maximum gradation level that can be displayed by each of the pixel units 40. Furthermore, since a gradation level that is below 0.2% of the maximum gradation level emitted by each of the pixel units 40 cannot be visually recognized by the human eye, it is further preferable that the one gradation level belonging to the low gradation region of the representative voltage-luminance characteristics be a gradation level that is 0.2% to 10% of the maximum gradation level.

Figure 18:
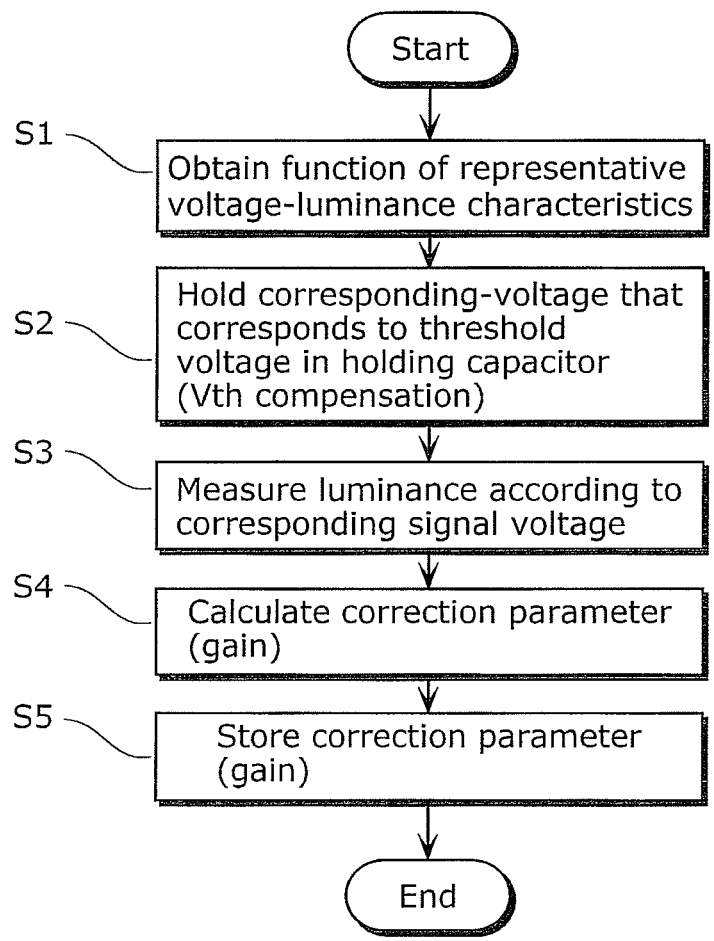
FIG. 18 is a flowchart showing an example of operations for calculating the correction parameter in the luminance measurement system in the present embodiment.

Next, the flow of the correction parameter calculation process shall be described with reference to the Drawings. FIG. 18 is a flowchart showing an example of operations for calculating the correction parameter in the luminance measurement system in the present embodiment.

First, the function of the representative voltage-luminance characteristics is obtained (S1). Specifically, the measurement control unit 201 obtains the function of the representative voltage-luminance characteristics that is common among the pixel units 40 included in the display panel 106.

Next, the measurement control unit 201 performs Vth compensation which causes the holding capacitor C1, included in a pixel unit 40 and to which the corresponding-voltage that corresponds to the threshold voltage Vth of the drive transistor Q1 is to be held, to hold the corresponding-voltage that corresponds to the threshold voltage Vth of the drive transistor (Q1) (S2). Subsequently, the luminance according to such corresponding signal voltage is measured (S3).

Specifically, the signal voltage corresponding to one gradation level belonging to the high gradation region of the representative voltage-luminance characteristics is inputted to the pixel unit 40. Then, Vth compensation for causing the holding capacitor C1 to hold the corresponding-voltage that corresponds to the threshold voltage Vth of the drive transistor Q1 is performed in the Vth compensation circuit of the pixel unit 40. As such, since the offset is added to the pixel unit 40 through the Vth compensation, the pixel unit 40 emits light in a state where unevenness in the threshold voltage Vth of the drive transistor Q1 is suppressed. Then, in such state, luminance measurement is performed using the measuring device 210. Specifically, the signal voltage corresponding to one gradation level belonging to the high gradation region of the representative voltage-luminance characteristics is applied to the drive transistor Q1 included in the pixel unit 40 in the state where the holding capacitor C1 is holding the corresponding voltage, and luminance emitted by the pixel unit 40 is measured using the measuring device 210.

Next, the correction parameter calculation unit 202 calculates the correction parameter (gain) (S4).

Specifically, the correction parameter calculation unit 202 calculates, for each of the pixel units 40, the correction parameter (gain) with which the luminance of the pixel unit 40 measured in S3 becomes the standard luminance obtained when the corresponding signal voltage is inputted to the function of the representative voltage-luminance characteristics.

Next, the calculated correction parameters are stored (S5). Specifically, the correction parameter calculation unit 202 stores each of the correction parameters (gain) calculated in S4, in the storage unit 102, in association with the corresponding pixel unit 40. More specifically, by outputting the calculated correction parameters (gain) to the control unit 101, the correction parameter calculation unit 202 causes the control unit 101 to write the correction parameters (gain) in the storage unit 102 and update the correction parameter table 102*a*.

Thus, the correction parameter is calculated in the luminance measurement system in the manner described above.

It should be noted that the above-described process is performed for the respective colors, namely, the red color, green color, and blue color emitted by the organic EL element D1. In other words, the measurement control unit 201 measures and obtains the luminance of the pixel units 40 according to the predetermined voltage, for the respective colors, namely, the red color, the green color, and the blue color. Then, the correction parameter calculation unit 202 obtains the correction parameter (gain) for the respective colors, namely, the red color, green color, and blue color. Subsequently, the correction parameter calculation unit 202 outputs the calculated correction parameters (gain) to the control unit 101, and causes the control unit 101 to write the correction parameters (gain) in the storage unit 102, for the respective colors, namely, the red color, green color, and blue color.

Furthermore, in the organic EL display device 100 in which the correction parameters (gain) are written in the storage unit 102, the control unit 101 reads, from the storage unit 102, the respective correction parameters (gain) corresponding to the pixel units 40 for the image signal inputted from the external source, and corrects the image signals corresponding to the respective pixel units 40 for conversion into corrected signal voltages. Subsequently, the control unit 101 controls the scanning line drive circuit 103 and the data line drive circuit 104 and causes the display panel 106 to display an image, based on the corrected image signal (corrected signal voltage).

Figure 19:
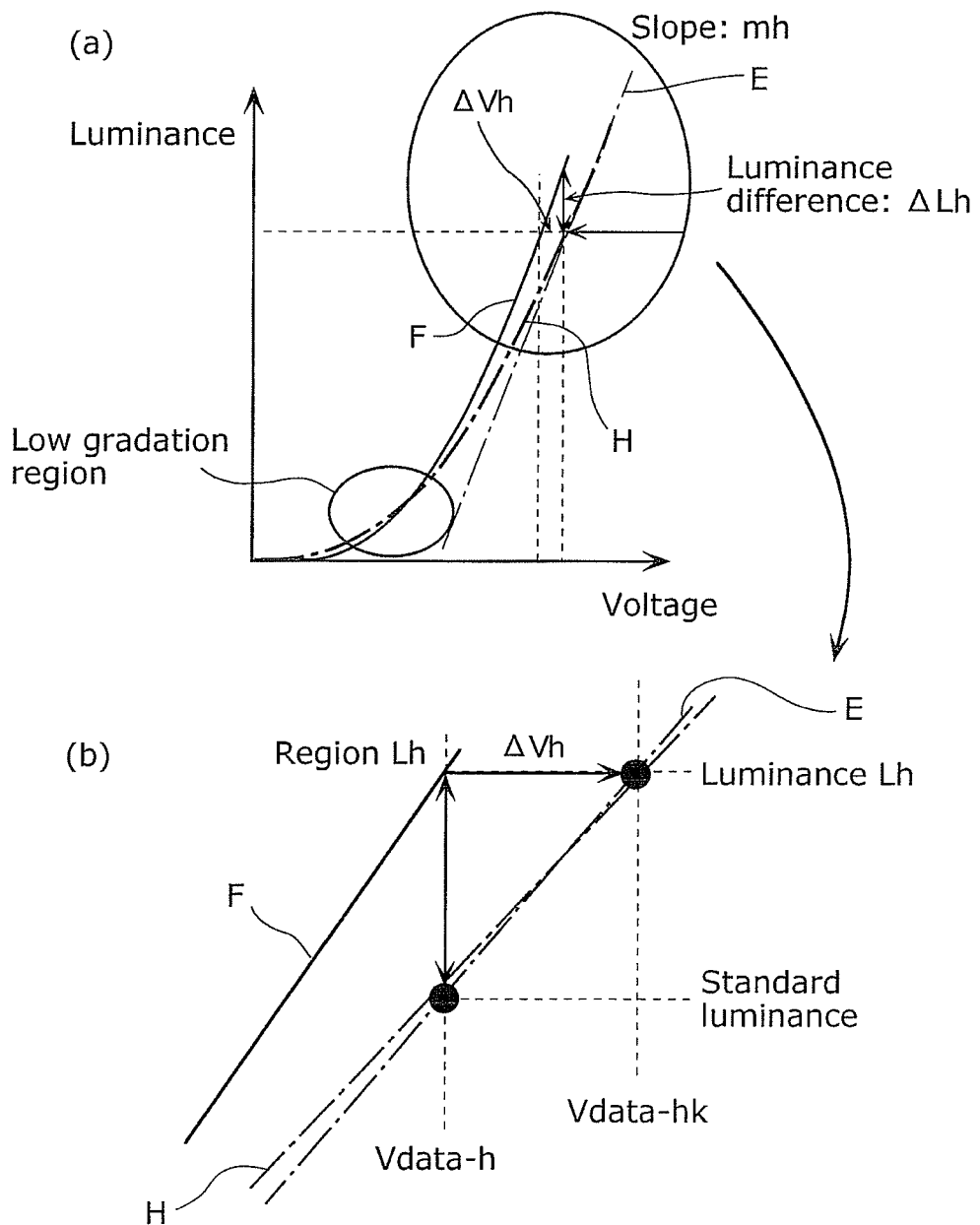
FIG. 19 is a diagram for describing a process by which a correction parameter calculation unit calculates the correction parameter in the present embodiment.
Figure 20:
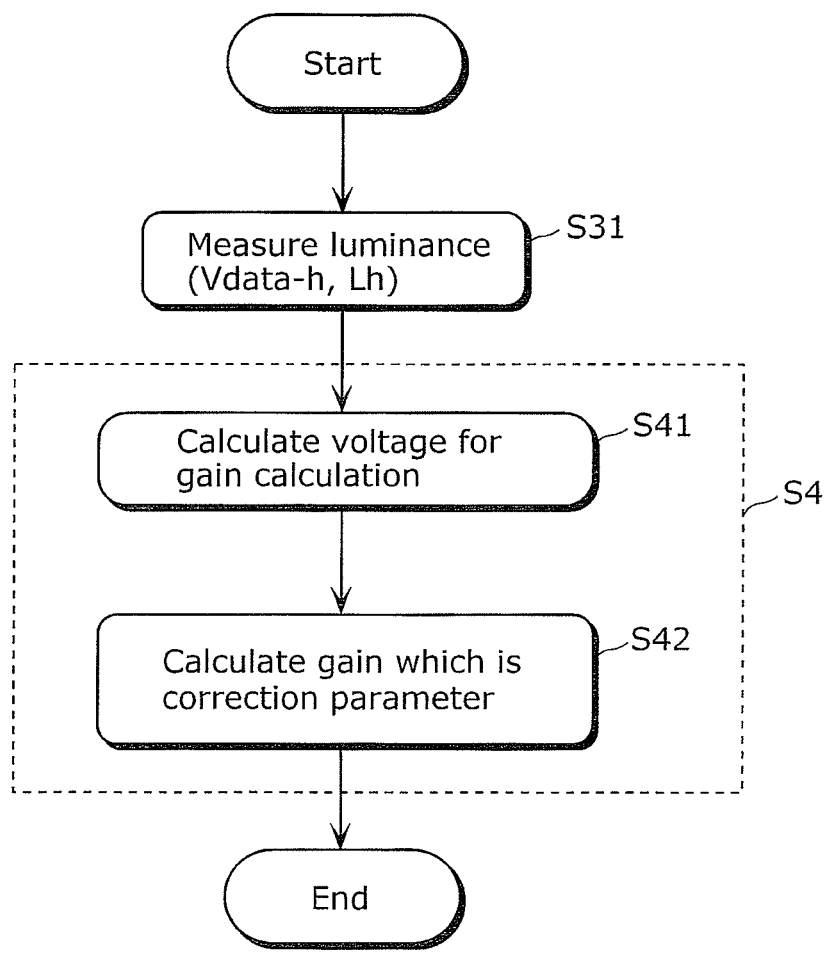
FIG. 20 is a flowchart showing an example of a process by which the correction parameter calculation unit calculates the correction parameter.
Figure 21:
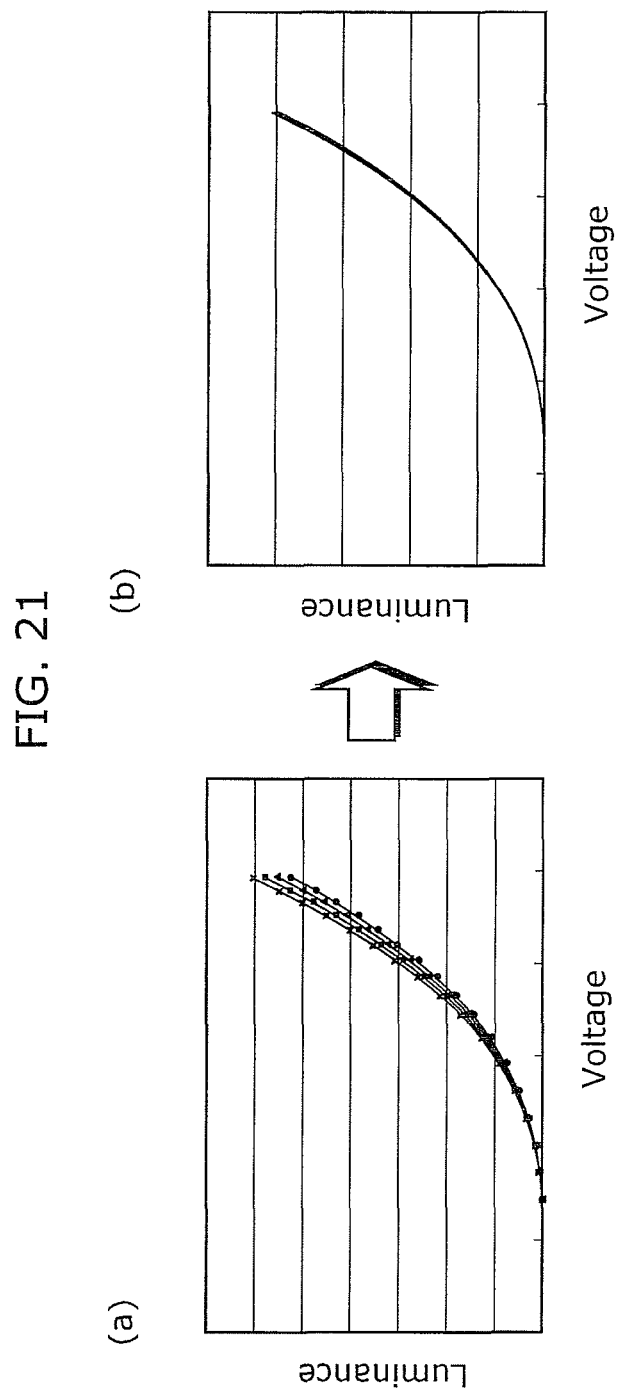
FIG. 21 is a diagram showing an effect of the correction parameter calculation process performed by the correction parameter calculation unit in the present embodiment.

FIG. 19 is a diagram for describing the process by which the correction parameter calculation unit calculates the correction parameter in the present embodiment. It should be noted that a curve E shown in FIG. 19 shows the representative voltage-luminance characteristics, and a curve F shows the voltage-luminance characteristics after the Vth compensation of the pixel unit 40. A curve H shows the voltage-luminance characteristics after the curve F showing the voltage-luminance characteristics of the pixel is corrected using the correction parameter (gain). In other words, the curve H is the curve after the curve F is corrected using the correction parameter (gain). Furthermore, FIG. 20 is a flowchart showing an example of the process by which the correction parameter calculation unit calculates the correction parameter. It should be noted that FIG. 20 shows an example of the calculation method for S3 and S4 in FIG. 18. Furthermore, FIG. 21 is a diagram showing the effect of the correction parameter calculation process performed by the correction parameter calculation unit in the present embodiment.

The correction parameter calculation unit 202 calculates, for the pixel unit 40, a correction parameter with which the luminance when the pixel unit 40 is caused to emit light according to the corresponding signal voltage (that is, the Vth-compensated signal voltage) becomes the luminance (standard luminance) obtained when the predetermined signal voltage is inputted to the function of the representative voltage-luminance characteristics. Specifically, as shown in FIG. 19, the correction parameter calculation unit 202 calculates the correction parameter (gain) such that the curve F showing the voltage-luminance characteristics for the pixel unit 40 approaches the curve E showing the representative voltage-luminance characteristics. Here, since the voltage-luminance characteristics for the pixel unit 40 shown by the curve F is Vth-compensated voltage-luminance characteristics, the curve F is uniform in the low gradation region.

Specifically, as shown in FIG. 20, first, luminance measurement is performed (S31). In other words, the correction parameter calculation unit 202 measures the luminance when the pixel unit 40 is caused to emit light according to the corresponding signal voltage (Vdata_h) in accordance with the function of the representative voltage-luminance characteristics.

Next, the correction parameter calculation unit 202 calculates a gain calculation voltage which is a voltage obtained when the luminance is inputted (S41). Specifically, as shown in FIG. 19, the correction parameter calculation unit 202 calculates a gain calculation voltage Vdata_hk which is the voltage obtained in the case where the luminance Lh when the pixel unit 40 is caused to emit light according to the corresponding signal voltage Vdata_h is inputted to the curve E.

Next, the correction parameter calculation unit 202 calculates the gain which is the correction parameter, using the corresponding signal voltage and the gain calculation voltage. Specifically, the correction parameter calculation unit 202 calculates a gain G according to the equation below, using the corresponding signal voltage Vdata_h and the gain calculation voltage Vdata_hk.

$$\Delta Vh = V\text{data\_}hk - V\text{data\_}h \quad \text{(Equation 6)}$$

$$G = \{1 - \Delta Vh/(V\text{data\_}h + \Delta Vh)\} \quad \text{(Equation 7)}$$

In other words, the gain G is a numerical value showing the ratio of the corresponding signal voltage Vdata_h to the gain calculation voltage Vdata_hk.

It should be noted that the correction parameter calculation unit 202 may calculate the gain G using a method other than that described above, and may, for example, calculate the gain G by calculating $\Delta Vh$ using (i) the luminance difference $\Delta Lh$ between the luminance Lh and the standard luminance and (ii) a slope mh of the curve E shown in FIG. 19.

In this manner, the correction parameter calculation unit 202 calculates the correction parameter (gain).

Therefore, in the organic EL display device 100, adjusting the gain, which is the correction parameter, to match the luminance of the high gradation-side in the state where Vth compensation functions as shown in (a) in FIG. 21 makes it possible to even-out the gain in all the gradation levels as shown in (b) in FIG. 21.

(Modification)

Although the correction parameter (gain) is determined for the pixel units 40 included in the display panel 106 in the above-described embodiment, the present invention is not limited to such. The display panel 106 may be divided into segments, and the correction parameter (gain) may be determined for each of the segments.

Figure 22:
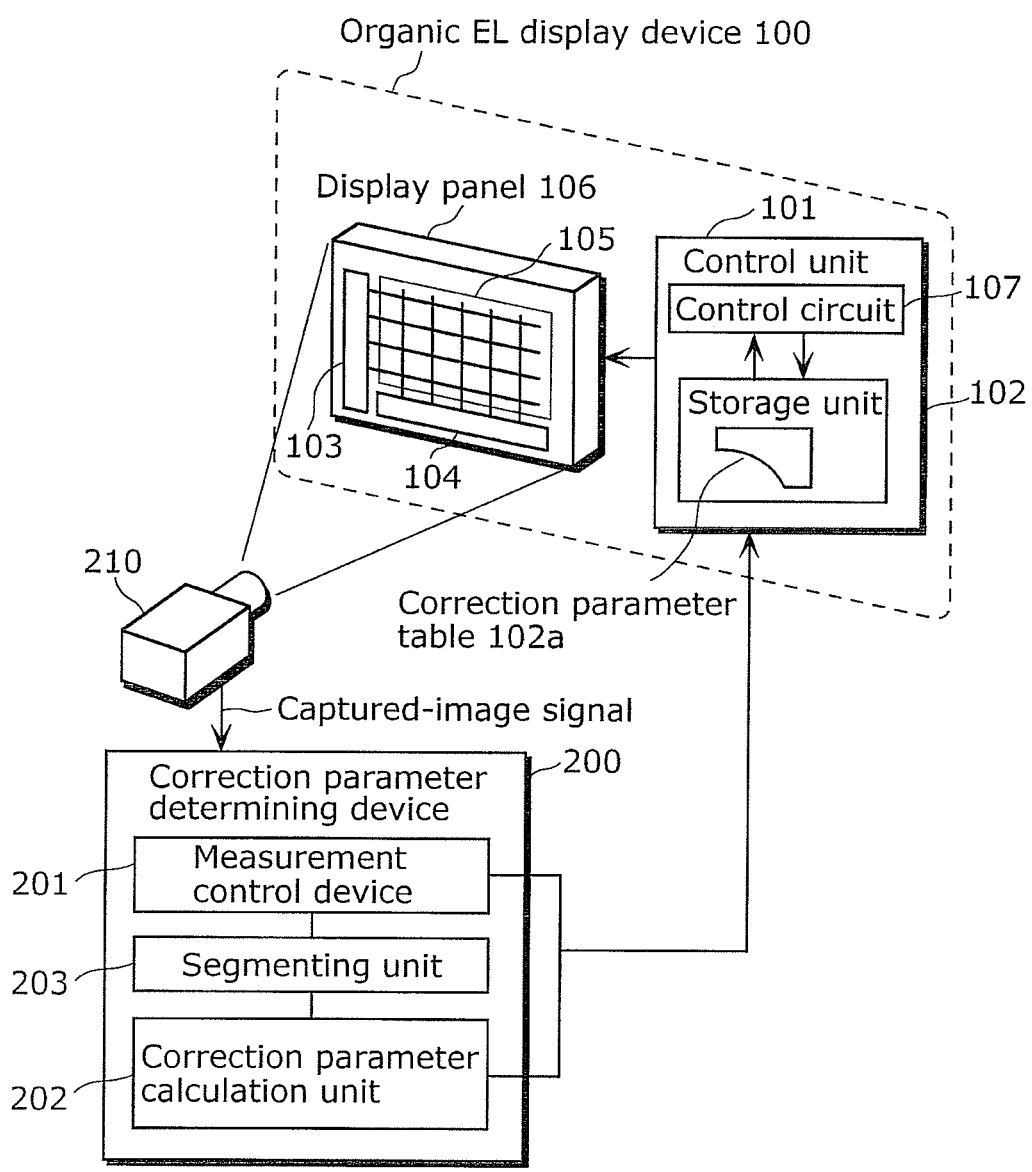
FIG. 22 is a diagram showing a configuration of a luminance measurement system at the time of luminance measurement of the display panel, according to a modification of the present embodiment.

FIG. 22 is a diagram showing a configuration of a luminance measurement system at the time of luminance measurement for a display panel according to the modification of the present embodiment. It should be noted that, since the control unit 101, the display panel 106, and the measuring device 210 have the same functions as the control unit 101, the display panel 106, and the measuring device 210 shown in FIG. 13, detailed description thereof shall be omitted.

The correction parameter determining device 200 includes a segmenting unit 201 aside from the measurement control unit 201 and the correction parameter calculation unit 202.

The segmenting unit 203 divides the display panel 106 into segments, and issues an instruction to the measurement control unit 201 and the correction parameter calculation unit 202 so that processing is performed on a per segment basis.

Following the instruction of the segmenting unit 203, the measurement control unit 201 obtains, on a per segment basis, the function of the representative voltage-luminance characteristics common among the pixel units 40 included in each of the segments.

Following the instruction of the segmenting unit 203, the correction parameter calculation unit 202 calculates the correction parameter (gain) with which the luminance when a pixel unit 40 included in a segment measured by the measurement control unit 201 is caused to emit light according to the corresponding signal voltage (Vth-compensated signal voltage) becomes the standard voltage obtained when the corresponding signal voltage (Vth-compensated signal voltage) is inputted to the function of the representative voltage-luminance characteristics for the segment. Furthermore, following the instruction of the segmenting unit 203, the correction parameter calculation unit 202 calculates a correction parameter (gain) with which the luminance when the pixel unit 40 included in the segment measured by the measurement control unit 201 is caused to emit light according to the corresponding signal voltage (Vth-compensated signal voltage) becomes the standard luminance obtained when the corresponding signal voltage (Vth-compensated voltage) is inputted to the function of the representative voltage-luminance characteristics for the segment.

Figure 23:
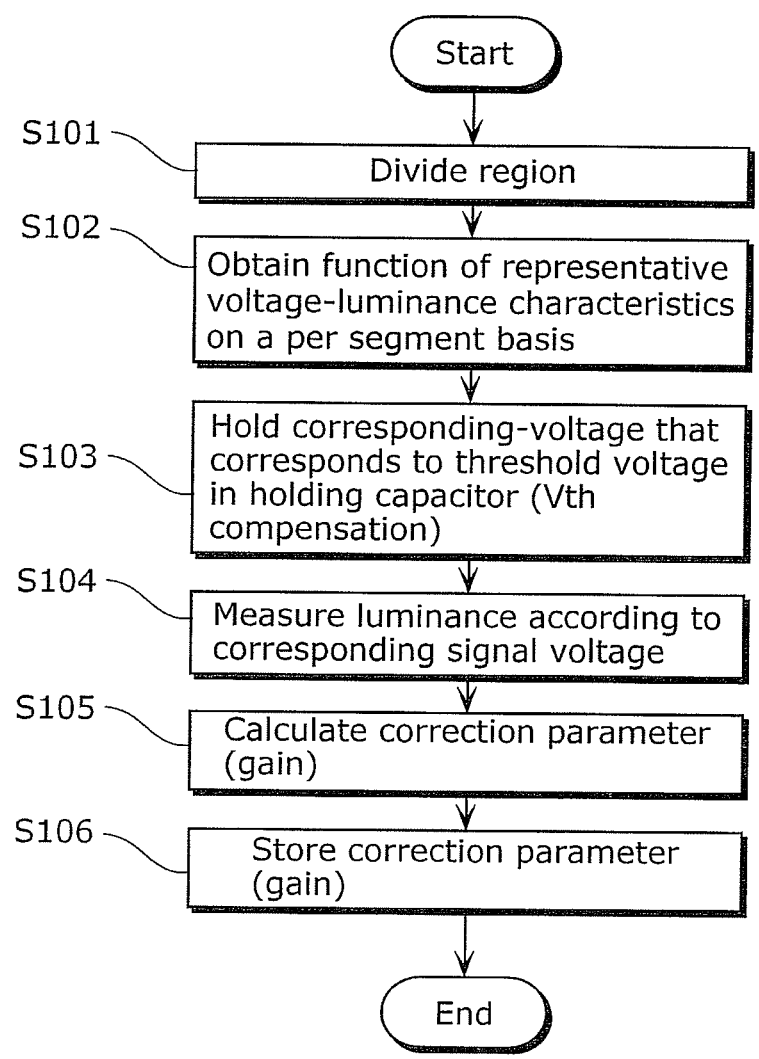
FIG. 23 is a flowchart showing an example of operation by which a correction parameter determining device 200 determines the correction parameter, according to the modification of the present embodiment.

FIG. 23 is a flowchart showing an example of operation by which the correction parameter determining device 200 determines the correction parameter, according to the modification of the present embodiment.

First, the segmenting unit 203 divides the display panel 106 into segments (S101). Here, although there is no particular limitation as to the number of segments into which the segmenting unit 203 divides the display panel 106, the segmenting unit 203, for example, divides the display panel 106 into 16 vertical×26 horizontal segments.

Next, the measurement control unit 201 obtains, for each of such segments, the function of the representative voltage-luminance characteristics common among the pixel units 40 included in each of the segments (S102).

Next, the control unit 101 performs Vth compensation which causes the capacitor C1, included in the pixel unit 40 to which the corresponding-voltage that corresponds to the threshold voltage Vth of the drive transistor Q1 is to be held, to hold the corresponding-voltage that corresponds to the threshold voltage Vth of the drive transistor (Q1) (S103). Subsequently, measurement control unit 201 measures the luminance according to such corresponding signal voltage (S103). It should be noted that, since details are the same as in S2 and S3 in FIG. 18, description thereof shall be omitted.

Next, the measurement control unit 201 measures and obtains, using the measuring device 210, the luminance according to the above described corresponding signal voltage for the pixel units 40 included in all of the segments (S104). Here, the measurement control unit 201 simultaneously obtains the luminance of the pixel units 40 by causing the pixel units 40 included in all of the segments to simultaneously emit light according to the above-described corresponding signal voltage.

Next, the correction parameter calculation unit 202 calculates the correction parameter (gain) for the pixel units 40 included in all of the segments (S105). Specifically, the correction parameter calculation unit 202 calculates, for the pixel unit 40, a correction parameter (gain) with which the luminance when the pixel unit 40 is caused to emit light according to the corresponding signal voltage (Vth-compensated signal voltage) becomes the luminance obtained when the corresponding signal voltage (Vth-compensated signal voltage) is inputted to the function of the representative voltage-luminance characteristics for the segment including the pixel unit 40.

Subsequently, the correction parameter calculation unit 202 stores the calculated correction parameter (gain) in the storage unit 102, in association with the pixel unit 40.

In this manner, the display panel 106 is divided into segments, and the representative voltage-luminance characteristics common among the pixel units 40 included in each of the segments is set on a per segment basis. In addition, a correction parameter (gain) is calculated so that the luminance when the pixel unit 40 is caused to emit light according to the corresponding signal voltage (Vth-compensated signal voltage) becomes the luminance obtained when the corresponding signal voltage (Vth-compensated signal voltage) is inputted to the function of the representative voltage-luminance characteristics for the segment including the pixel unit 40. With this, it is possible, for example, to correct only a segment in which luminance unevenness occurs due to severe change in luminance between adjacent pixels, and thus it is possible to calculate a correction parameter (gain) with which the change in luminance between adjacent pixels becomes smooth.

As described above, according to the present invention, by including a Vth compensation circuit and performing a correction parameter (gain) calculation process once, it is possible to realize an organic EL display device and a manufacturing method thereof which can shorten the measuring tact, from when the luminance measurement for each pixel is performed up to when the correction parameter is obtained.

Here, FIG. 24 is a diagram for describing effects of the organic EL display device and the manufacturing method thereof according to the present invention.

In this manner, with the organic EL display device and the manufacturing method thereof according to the present invention, by configuring a Vth compensation circuit inside the pixel unit and performing luminance measurement at the time of manufacturing (called external correction), it is not only possible to perform Vth compensation (offset correction) and mobility correction (gain correction) in the initial period (at the time of manufacturing), but Vth compensation (offset correction) also becomes possible in the course of time by using the Vth compensation circuit configured inside the pixel unit, as shown in (b) in FIG. 24. Meanwhile, in the case where it is assumed that the conventional Vth compensation circuit and the conventional external correction are combined as shown in (a) in FIG. 24, offset correction and gain correction are performed and, in addition, multi-point measurement, in which the measurement gradation level requiring luminance measurement is at least three points, is performed at the time of external correction, and thus measurement tact takes time. In contrast, although the present invention combines the Vth compensation circuit and the external correction, since gain correction is not performed and, in addition, it is sufficient to have one point as the measurement gradation level requiring luminance measurement at the time of external correction, the present invention produces the effect of allowing measurement tact to be shortened.

In this manner, according to the organic EL display device and the manufacturing method thereof according to the present invention, in the manufacturing process of the organic EL display device, luminance measurement for each pixel is performed only once on one gradation level belonging to a high gradation region of the representative voltage-luminance characteristics, and a correction parameter for matching the luminance at the one gradation level belonging to the high gradation region of the representative voltage-luminance characteristics is calculated from this one-time luminance measurement. Then, the image signal inputted from the external source is corrected by multiplying the image signal by the correction parameter, and a corrected signal voltage which corresponds to the corrected image signal is applied to the respective pixel units. Furthermore, a circuit for compensating the threshold voltage of a drive element is configured in each of the pixel units included in the display panel of the organic EL display apparatus. Specifically, the corrected signal voltage is supplied to the capacitor in the state where the capacitor is holding the corresponding-voltage that corresponds to the threshold voltage of the drive element. Subsequently, current is caused to flow to the light-emitting element by supplying, between the gate and source electrodes of the drive element, a predetermined signal voltage obtained by adding the corrected signal voltage to the aforementioned corresponding-voltage.

Accordingly, since the light-emitting element is caused to emit light by supplying the predetermined signal voltage between the gate and source electrodes of the drive element, the drive current of the drive element which flows to the light-emitting element becomes a current corresponding to a voltage obtained by subtracting the threshold voltage of the drive element from the predetermined signal voltage. As such, it is possible to suppress variation of threshold voltage among drive elements included in the respective pixel units.

In this manner, variation of threshold voltage among drive elements included in the respective pixel units can be suppressed in the state where the luminance in the one gradation level belonging to the high gradation region is matched to the representative voltage-luminance characteristics, and thus correction precision in the low gradation region of the representative voltage-luminance characteristics can be enhanced.

Furthermore, since the correction parameter can be calculated by merely performing the luminance measurement on the respective pixel units for one gradation level belonging to the high gradation region of the representative voltage-luminance characteristics in the manufacturing process of the organic EL display device, it is possible to significantly shorten the measurement tact from when luminance measurement for the respective pixels is performed up to when the correction parameter is calculated, as compared to the conventional least-square method.

Meanwhile, with the conventional method of correcting the image signal using the correction parameter obtained at the time of the manufacturing process, it is possible to perform correction for the initial mobility and threshold voltage of a drive element. However, deterioration over time arises in drive element characteristics due to the frequency of use. As a result, the variation in threshold voltage also changes with the passing of time. As such, with the conventional correction method, it is not possible to perform correction up to the threshold voltage following the deterioration over time of the drive element characteristics. Meanwhile, in the case where a circuit for correcting the threshold voltage is configured in a pixel unit, even when the image signal is supplied without being corrected using the correction parameter, it is possible to perform correction not only for the threshold voltage in the initial period of the drive element, but also the threshold voltage following deterioration over time. However, it was not possible to correct the variation in drive element mobility in the initial period.

In contrast, in the present invention, the threshold voltage of the drive element is corrected in the pixel unit while the image signal is corrected using the correction parameter, and thus, together with being able to correct initial mobility and threshold voltage of the drive element, it is possible to perform correction even up to the deterioration over time of the threshold voltage of the drive element.

Furthermore, according to the organic EL display device and the manufacturing method thereof according to the present invention, when the drive transistor is, for example, an enhancement N-channel thin-film transistor, the corresponding-voltage that corresponds to the threshold voltage is a voltage that has a voltage value that is proportional to the voltage value of the threshold voltage and is smaller than the voltage value of the threshold voltage. In other words, the voltage that the capacitor is holding is not the threshold voltage value itself but a voltage value that is smaller than the value of the threshold voltage. As such, the low gradation region of the representative voltage-luminance characteristics corresponds to a region showing a voltage value that is smaller than the threshold voltage. With this, a value smaller than the voltage value of the threshold voltage is added to the corrected signal voltage, and thus the correction precision in the low gradation region of the representative voltage-luminance characteristics can be enhanced. It should be noted that the drive transistor Q1 may be, for example, a depression N-channel thin-film transistor, or it may be an enhancement P-channel thin-film transistor or a depression P-channel thin-film transistor. No matter which of these types of thin-film transistors is used, it can be said that the corresponding-voltage that corresponds to the threshold voltage is a voltage (gate voltage) for which current is smaller than the current flowing when threshold voltage is applied to the gate of the drive transistor Q1. In this manner, a gate voltage for which current is smaller than the current flowing when the threshold voltage is added to the corrected signal voltage, and thus the correction precision in the low gradation region of the representative voltage-luminance characteristics can be enhanced.

Although the organic EL display device and the organic EL display device manufacturing method according to the present invention have been described based on an embodiment, the present invention is not limited to such embodiment. 0>Various modifications of the exemplary embodiment as well as embodiments resulting from arbitrary combinations of constituent elements of different exemplary embodiments that may be conceived by those skilled in the art are intended to be included within the scope of the present invention as long as these do not depart from the essence of the present invention.

INDUSTRIAL APPLICABILITY

The present invention is particularly useful as method of manufacturing an organic EL flat-panel display in which an organic EL display device is built into, and is most suitable for use as a method of manufacturing an organic EL display device that can reduce luminance unevenness in a display panel while reducing measuring time.

What is claimed is:

1. An organic electroluminescence display device, comprising:
 a display panel including pixels, each of the pixels including:
  a light-emitter,
  a driver including a gate, a source, and a drain, the driver being voltage-driven and controlling a supply of current to the light-emitter; and
  a first capacitor including a first electrode connected to the gate and a second electrode connected to one of the source and the drain;
 a storage configured to store a correction parameter for each of the pixels for correcting, in accordance with characteristics of each of the pixels, an image signal input from an external source; and
 a controller configured to, for each pixel of the pixels, obtain a corrected signal voltage by reading the correction parameter corresponding to the pixel from the storage and multiplying the image signal corresponding to the pixel by the correction parameter corresponding to the pixel,
 wherein the controller is configured to, for each of the pixels:
  cause, with each writing of the corrected signal voltage, the first capacitor to detect a threshold voltage of the driver;
  cause the first capacitor to hold a corresponding voltage that corresponds to the threshold voltage of the driver after the first capacitor detects the threshold voltage;
  supply the corrected signal voltage to the first capacitor when the first capacitor is holding the corresponding voltage that corresponds to the threshold voltage of the driver; and
  cause the current to flow to the light-emitter by supplying a first signal voltage between the gate and the source of the driver, the first signal voltage being obtained by adding the corrected signal voltage to the threshold voltage of the driver,
 the correction parameter is generated, for each of the pixels, by:
  obtaining a function of representative voltage-luminance characteristics common among the pixels included in the display panel;

causing the first capacitor to hold the corresponding voltage that corresponds to the threshold voltage of the driver;

applying, to the driver, a second signal voltage that corresponds to a single gradation level belonging to a high gradation region of the representative voltage-luminance characteristics when the first capacitor is holding the corresponding voltage that corresponds to the threshold voltage of the driver, and measuring an emitted luminance with a measurer;

calculating the correction parameter with which the emitted luminance, measured with the measurer, is corrected to a standard luminance, the standard luminance being obtained when the second signal voltage is input to the function of the representative voltage-luminance characteristics; and storing the correction parameter in the storage in association with a corresponding one of the pixels, when calculating the correction parameter, a correction voltage is calculated such that the emitted luminance is the standard luminance, and the correction parameter is a gain indicating a ratio between the second signal voltage and the calculated correction voltage.

2. The organic electroluminescence display device according to claim 1, wherein the second electrode of the first capacitor is electrically connected to the source of the driver via an isolation transistor, each of the pixels further includes:
 a first power line supplying a potential of the drain of the driver;
 a second power line connected to a cathode of the light emitter;
 a third power line supplying a first standard voltage that defines a voltage value of the first electrode of the first capacitor;
 a data line supplying a signal voltage;
 a first switch switchedly interconnecting the data line and the first electrode of the first capacitor;
 a second switch switchedly interconnecting the third power line and the first electrode of the first capacitor; and
 the isolation transistor, comprising a third switch, switchedly interconnecting the source of the driver and the second electrode of the first capacitor;
 a second capacitor having a fourth electrode and a fifth electrode, the fourth electrode connected to the second electrode of the first capacitor; and
 a bias voltage line connected to the fifth electrode of the second capacitor for causing a second standard voltage to be generated in the second electrode of the first capacitor, the second standard voltage being less than a difference of the first standard voltage minus the threshold voltage of the driver, and the controller is configured to, for each of the pixels:
 cause the first capacitor to generate a potential difference that is greater than the threshold voltage of the driver by applying the first standard voltage to the first electrode of the first capacitor by placing the second switch in a first ON state when the third switch is in a second ON state and after placing the first switch in a first OFF state, and by applying the second standard voltage to the second electrode of the first capacitor;
 cause the first capacitor to hold the corresponding voltage that corresponds to the threshold voltage of the driver by placing the second switch in a second OFF state and the third switch in a third OFF state after the potential difference of the first capacitor is the threshold voltage of the driver and the driver is turned OFF; and
 supply the corrected signal voltage to the first electrode of the first capacitor by placing the first switch in a third ON state while the second switch is in the second OFF state and when the first capacitor is holding the corresponding voltage that corresponds to the threshold voltage of the driver.

3. The organic electroluminescence display device according to claim 2, wherein the controller is further configured to, for each of the pixels:
 cause the first signal voltage to be generated in the first electrode of the first capacitor by supplying the corrected signal voltage to the first capacitor by placing the first switch in the third ON state when the first capacitor is holding the corresponding voltage that corresponds to the threshold voltage of the driver, the third signal voltage being obtained by adding, to the corresponding voltage that corresponds to the threshold voltage of the driver, the corrected signal voltage divided in accordance with a ratio between a first capacitance of the first capacitor and a second capacitance of the second capacitor; and
 subsequently cause the current to flow to the light-emitter by supplying the first signal voltage between the gate electrode and the source electrode of the driver by placing the third switch in a fourth ON state after placing the first switch in a fourth OFF state.

4. The organic electroluminescence display device according to claim 2, wherein the first standard voltage is set in advance so that a potential difference between the cathode and an anode of the light-emitter when the first standard voltage is applied to the first electrode of the first capacitor is less than a threshold voltage of the light-emitter at which the light-emitter emits light.

5. The organic electroluminescence display device according to claim 1, wherein the corresponding voltage that corresponds to the threshold voltage of the driver is such that a resultant current is less than when the threshold voltage is applied to the gate electrode of the driver.

6. The organic electroluminescence display device according to claim 1, wherein the corresponding voltage that corresponds to the threshold voltage of the driver is proportional to the threshold voltage of the driver and smaller than the threshold voltage of the driver.

7. The organic electroluminescence display device according to claim 1, wherein the second signal voltage that corresponds to the single gradation level belonging to the high gradation region of the representative voltage-luminance characteristics is approximately 20% to approximately 100% of a maximum gradation level that is displayable by each of the pixels.

8. The organic electroluminescence display device according to claim 1, wherein the second signal voltage that corresponds to the single gradation level belonging to the high gradation region of the representative voltage-luminance characteristics is approximately 30% of a maximum gradation level that is displayable by each of the pixels.

9. The organic electroluminescence display device according to claim 1, wherein the second signal voltage corresponds to a single gradation level belonging to an intermediate gradation region of the representative voltage-luminance characteristics and is approximately 10% to approximately 20% of a maximum gradation level that is displayable by each of the pixels.

10. The organic electroluminescence display device according to claim 1,
wherein the representative voltage-luminance characteristics are voltage-luminescence characteristics of one of the pixels included in the display panel.

11. The organic electroluminescence display device according to claim 1,
wherein the representative voltage-luminance characteristics are characteristics obtained by averaging voltage-luminescence characteristics of at least two of the pixels included in the display panel.

12. The organic electroluminescence display device according to claim 1,
wherein, when obtaining the function of the representative voltage-luminance characteristics, the display panel is divided into segments, and the representative voltage-luminance characteristics are obtained for each of the segments, the representative voltage-luminance characteristics being common among ones of the pixels included in each of the segments, and
when calculating the correction parameter, the correction parameter with which the emitted luminance becomes the standard luminance is calculated with the standard luminance being obtained when the first signal voltage is input to the function of the representative voltage-luminance characteristics for a corresponding one of the segments.

13. The organic electroluminescence display device according to claim 1,
wherein the measurer is an image sensor.

14. The organic electroluminescence display device according to claim 1,
wherein the storage is configured to store only the gain and not an offset as the correction parameter for correcting, in accordance with characteristics of each of the pixels, the image signal.

15. The organic electroluminescence display device according to claim 1, wherein the controller obtains the corrected signal voltage by directly multiplying the image signal of the pixel by the read correction parameter corresponding to the pixel.

16. A method of manufacturing an organic electroluminescence display, comprising:
obtaining a function of representative voltage-luminance characteristics common throughout a display panel, the display panel including pixels, each of the pixels including:
a light-emitter;
a driver including a gate, a source, and a drain, the driver being voltage-driven and controlling a supply of current to the light-emitter; and
a first capacitor including a first electrode connected to the gate and a second electrode connected to one of the source and the drain;
causing the first capacitor of a subject pixel of the pixels to hold a corresponding voltage that corresponds to a threshold voltage of the driver of the subject pixel, the subject pixel being processed from among the pixels included in the display panel;
applying, to the driver of the subject pixel, a signal voltage that corresponds to a single gradation level belonging to a high gradation region of the representative voltage-luminance characteristics when the first capacitor of the subject pixel is holding the corresponding voltage that corresponds to the threshold voltage of the driver, and measuring an emitted luminance emitted by the subject pixel with a measurer;
calculating, for the subject pixel, a correction parameter with which the emitted luminance emitted by the subject pixel and measured with the measurer is corrected to a standard luminance obtained when the signal voltage is input to the function of the representative voltage-luminance characteristics; and
storing the correction parameter in a storage in association with the subject pixel,
wherein, when calculating the correction parameter, a correction voltage is calculated such that the emitted luminance emitted by the subject pixel is the standard luminance, and
the correction parameter is a gain indicating a ratio between the signal voltage and the correction voltage.

* * * * *